United States Patent
Liaw

(10) Patent No.: US 11,670,703 B2
(45) Date of Patent: Jun. 6, 2023

(54) FIN AND GATE DIMENSIONS FOR OPTIMIZING GATE FORMATION

(71) Applicant: Taiwan Semiconductor Manufacturing Co., Ltd., Hsin-Chu (TW)

(72) Inventor: Jhon Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 239 days.

(21) Appl. No.: 16/694,614

(22) Filed: Nov. 25, 2019

(65) Prior Publication Data

US 2020/0091320 A1 Mar. 19, 2020

Related U.S. Application Data

(62) Division of application No. 15/976,664, filed on May 10, 2018, now Pat. No. 10,629,706.

(51) Int. Cl.
*H01L 29/66* (2006.01)
*H01L 29/423* (2006.01)
(Continued)

(52) U.S. Cl.
CPC .. *H01L 29/66795* (2013.01); *H01L 21/28123* (2013.01); *H01L 21/823412* (2013.01); *H01L 21/823431* (2013.01); *H01L 21/823437* (2013.01); *H01L 27/1104* (2013.01); *H01L 29/0649* (2013.01); *H01L 29/1037* (2013.01); *H01L 29/42364* (2013.01); *H01L 29/6656* (2013.01); *H01L 29/66545* (2013.01)

(58) Field of Classification Search
None
See application file for complete search history.

(56) References Cited

U.S. PATENT DOCUMENTS 8,399,931 B2 3/2013 Liaw et al.
8,653,630 B2 2/2014 Liaw et al.
(Continued)

FOREIGN PATENT DOCUMENTS

CN 1354521 A 6/2002
CN 106206298 A 12/2016
(Continued)

*Primary Examiner* — Nishath Yasmeen
(74) *Attorney, Agent, or Firm* — Haynes and Boone, LLP

(57) ABSTRACT

Integrated circuit devices having optimized fin and gate dimensions are disclosed herein. An exemplary integrated circuit device includes a first multi-fin structure and a fourth multi-fin structure. A first gate structure traverses the first multi-fin structure, such that the first gate structure is disposed over a first channel region. A fourth gate structure traverses the fourth multi-fin structure, such that the fourth gate structure is disposed over a fourth channel region. The first gate structure includes a first gate dielectric having a first thickness, and the fourth gate structure includes a fourth gate dielectric having a fourth thickness. The first thickness is greater than the fourth thickness. The first multi-fin structure has a first pitch in the first channel region, and the fourth multi-fin structure has a fourth pitch in the fourth channel region. The first pitch is greater than the fourth pitch.

20 Claims, 16 Drawing Sheets

(51) Int. Cl.
*H01L 21/28* (2006.01)
*H01L 21/8234* (2006.01)
*H01L 29/06* (2006.01)
*H01L 29/10* (2006.01)
*H01L 27/11* (2006.01)
*H10B 10/00* (2023.01)

(56) References Cited

U.S. PATENT DOCUMENTS

| | | | |
|---|---|---|---|
| 9,397,006 B1* | 7/2016 | Ok | H01L 29/66545 |
| 9,570,555 B1* | 2/2017 | Pranatharthiharan | H01L 27/0886 |
| 9,613,953 B2 | 4/2017 | Liaw | |
| 9,691,664 B1* | 6/2017 | Sung | H01L 29/66795 |
| 9,786,563 B2 | 10/2017 | Basker et al. | |
| 9,786,788 B1* | 10/2017 | Anderson | H01L 29/66742 |
| 2006/0231881 A1* | 10/2006 | Clark | H01L 21/845 257/308 |
| 2011/0084340 A1 | 4/2011 | Yuan et al. | |
| 2011/0212579 A1* | 9/2011 | Chen | H01L 21/76283 257/E21.616 |
| 2014/0035043 A1 | 2/2014 | Lee et al. | |
| 2015/0061018 A1 | 3/2015 | Leobandung | |
| 2017/0148681 A1 | 5/2017 | Basker et al. | |
| 2017/0271343 A1 | 9/2017 | Liaw | |
| 2017/0309624 A1 | 10/2017 | Cheng et al. | |
| 2018/0019316 A1 | 1/2018 | Cheng et al. | |
| 2018/0122930 A1 | 5/2018 | Okamoto et al. | |

FOREIGN PATENT DOCUMENTS

| | | |
|---|---|---|
| CN | 106206576 A | 12/2016 |
| TW | 201133793 A | 10/2011 |
| TW | 201349460 A | 12/2013 |

* cited by examiner

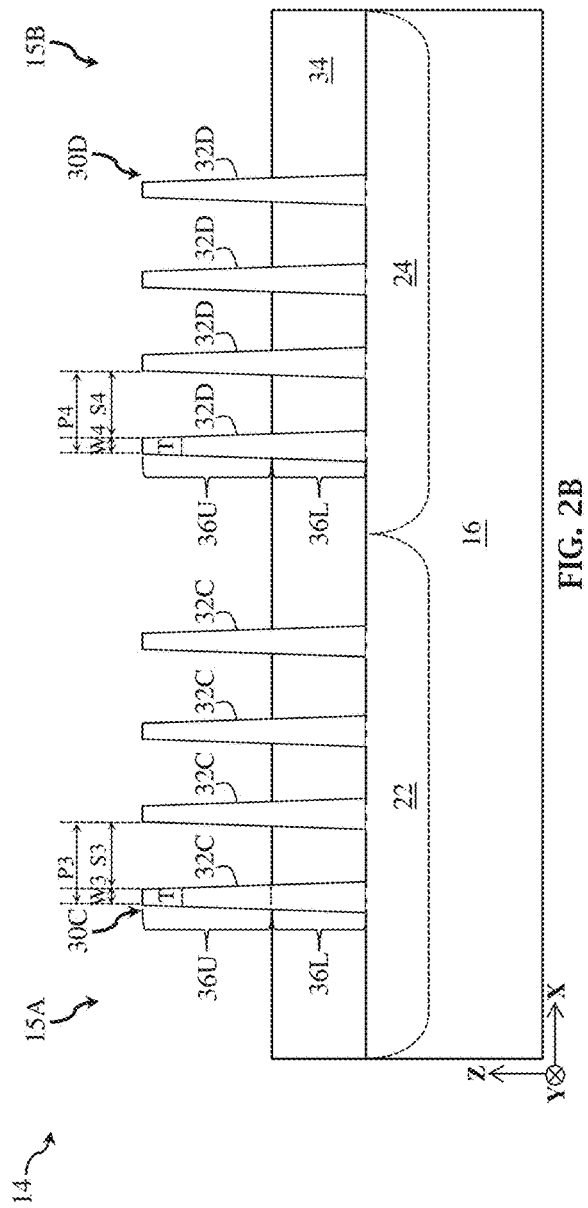
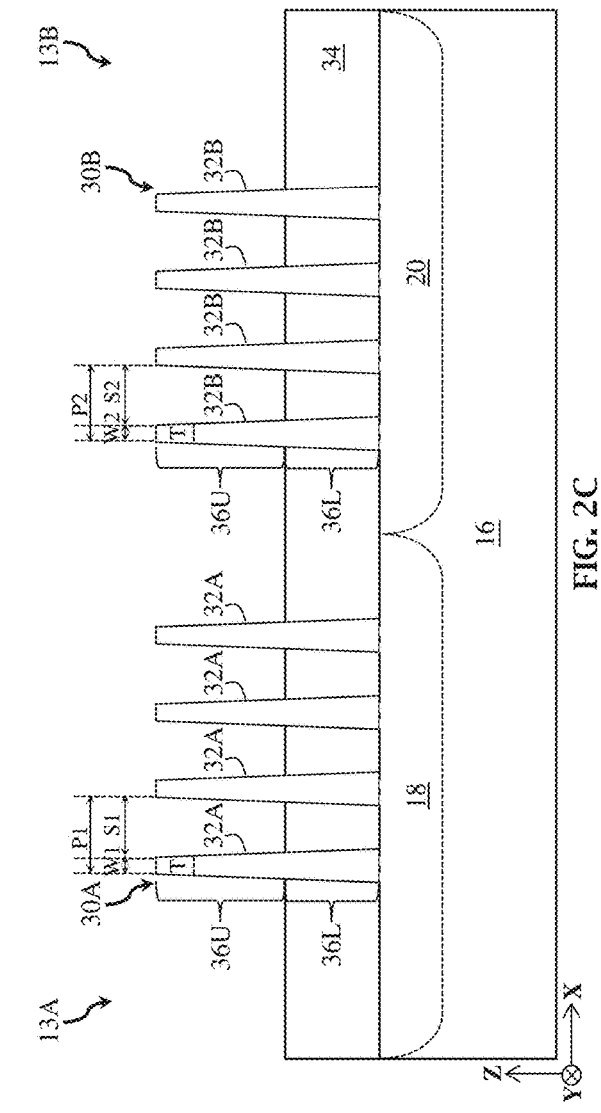
FIG. 2B
FIG. 2C

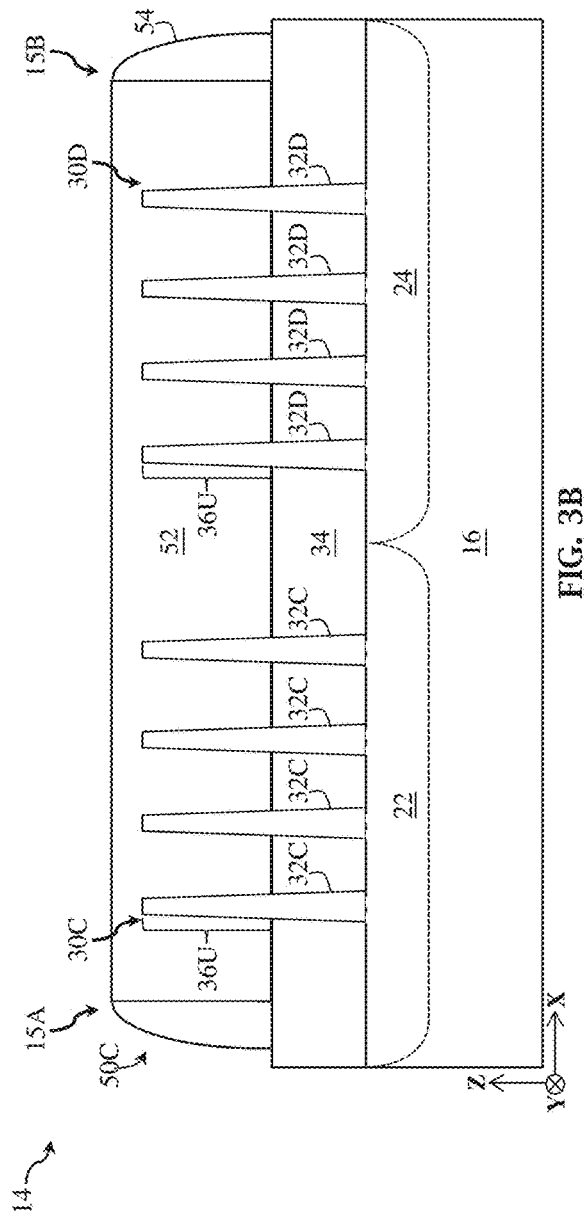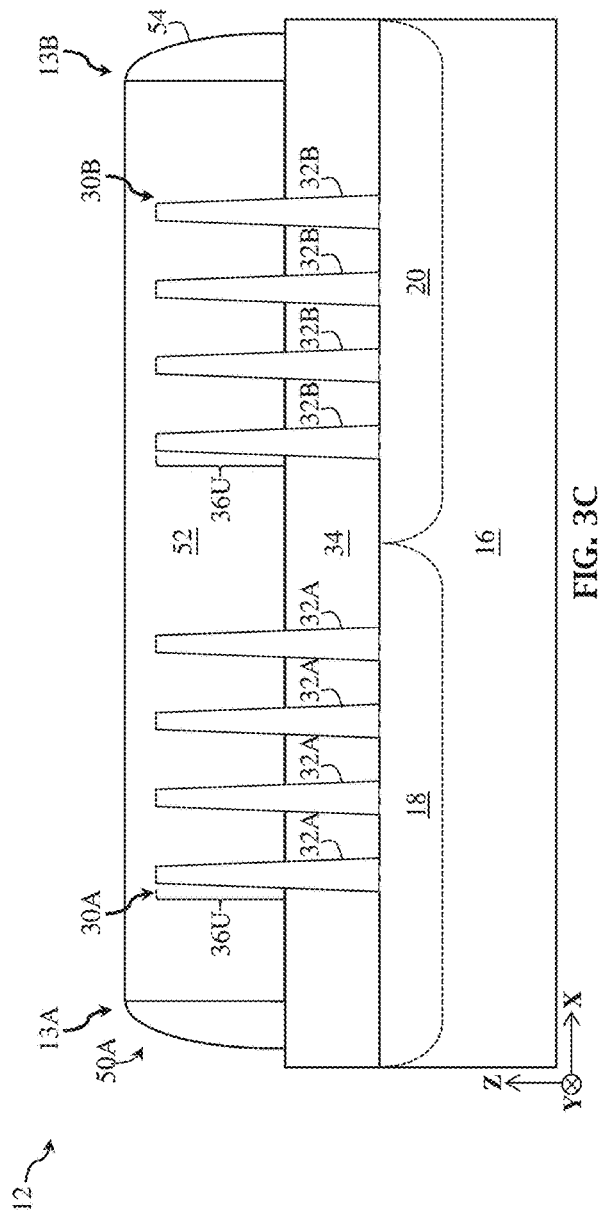

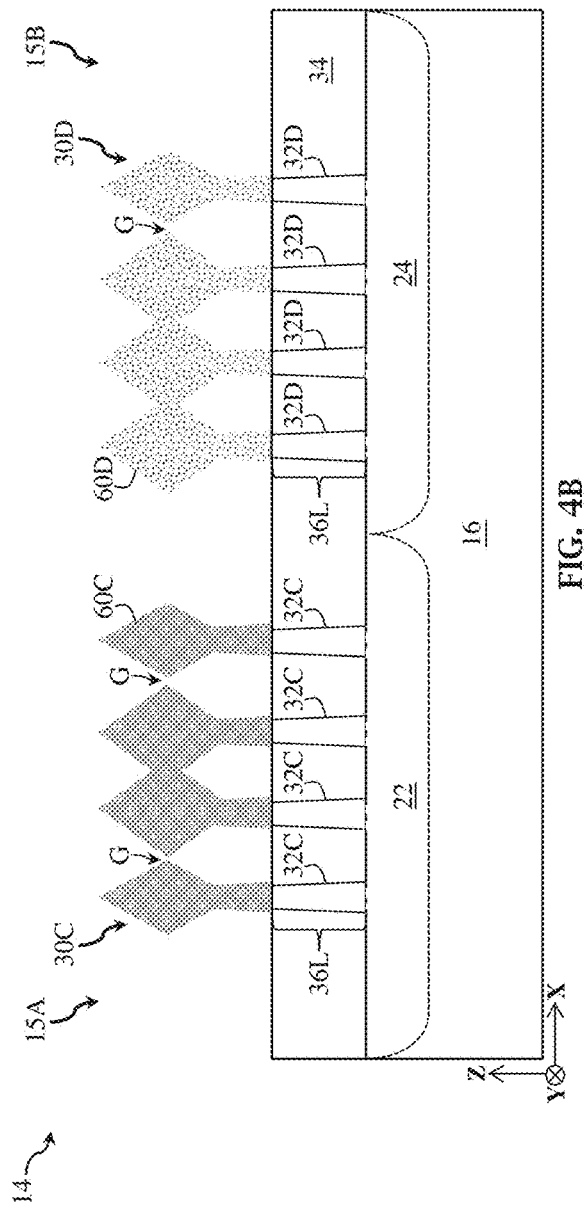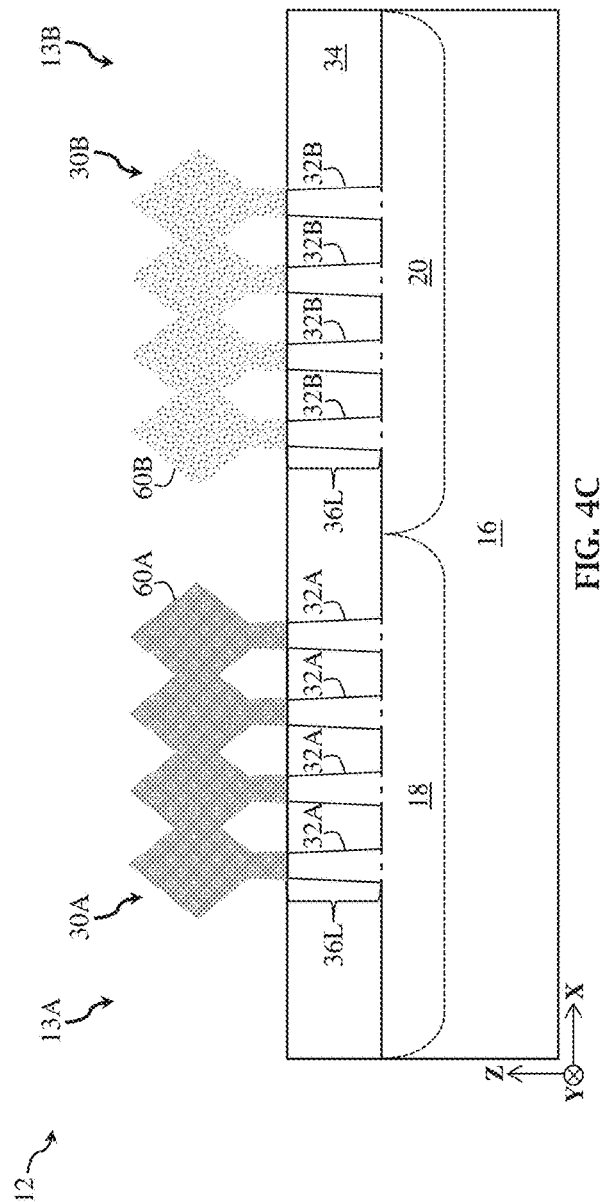
FIG. 4B
FIG. 4C

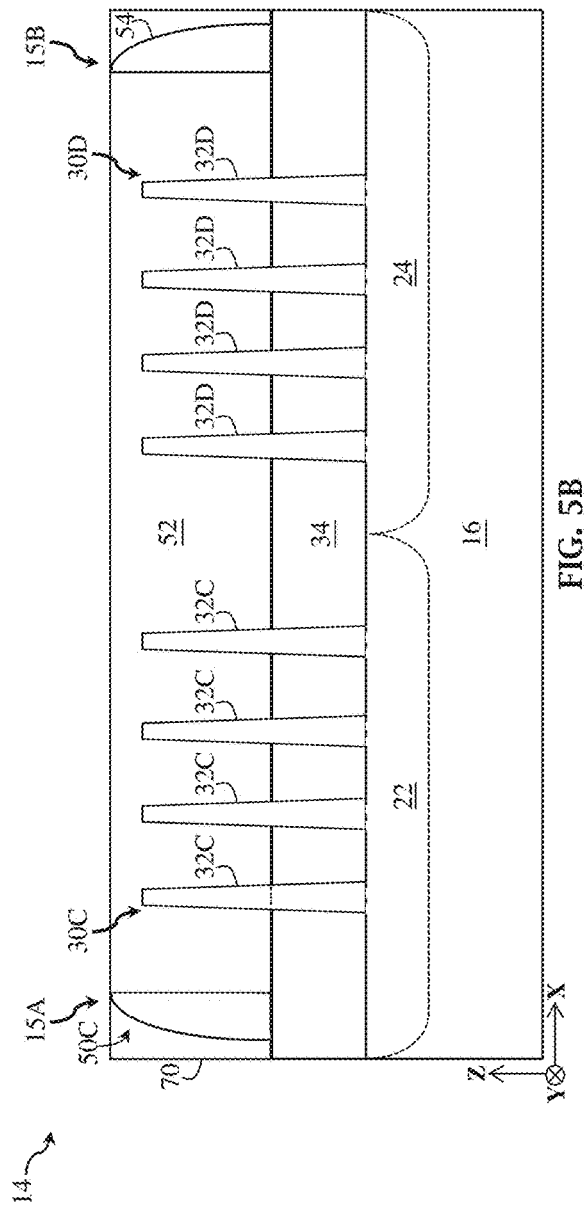
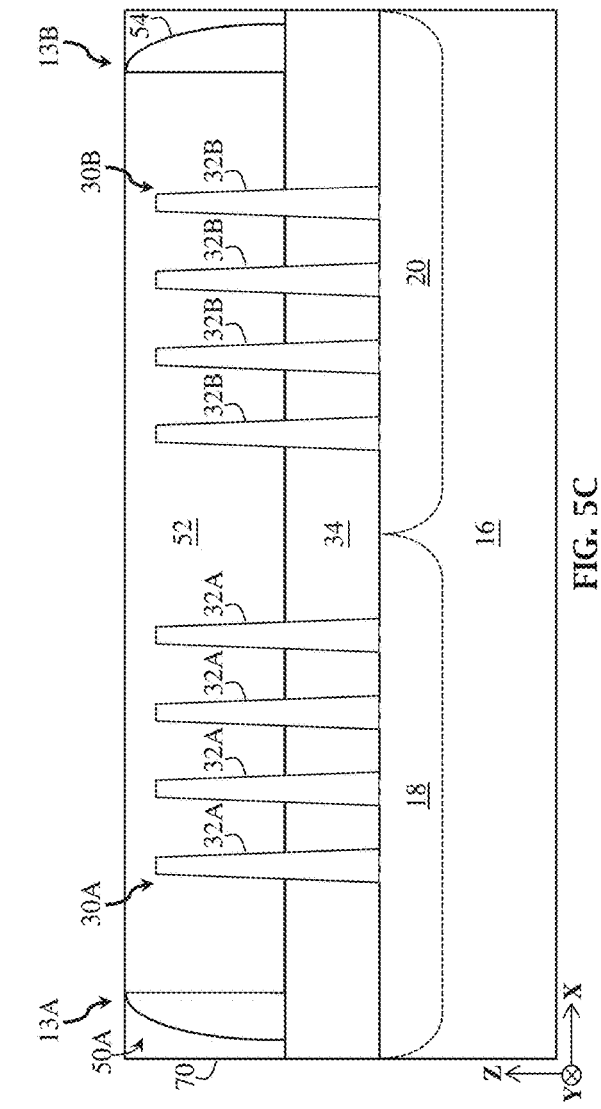

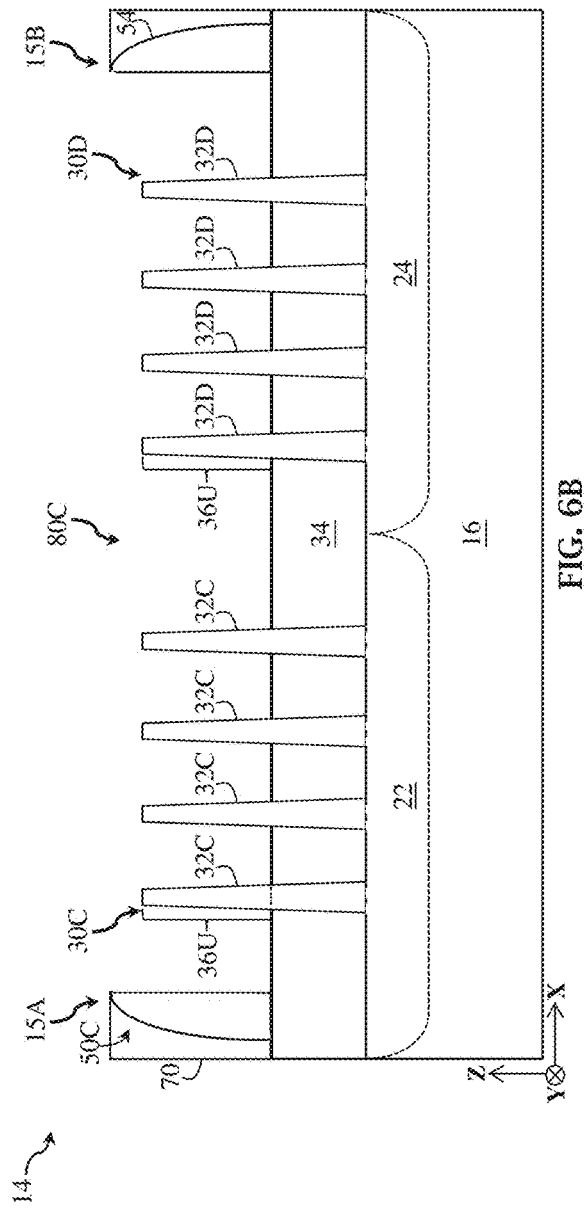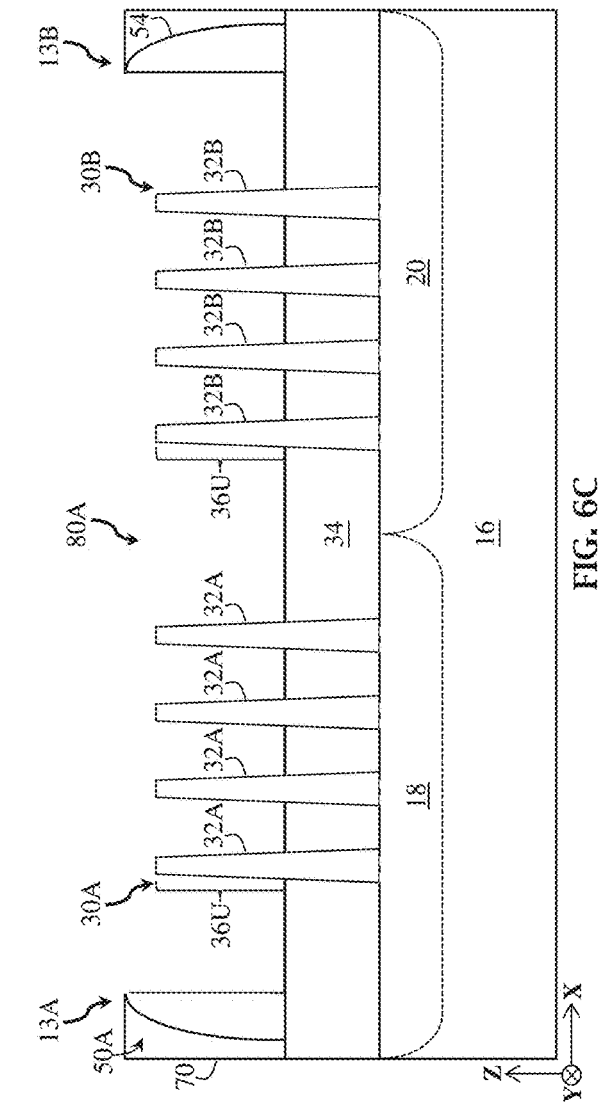
FIG. 6B
FIG. 6C

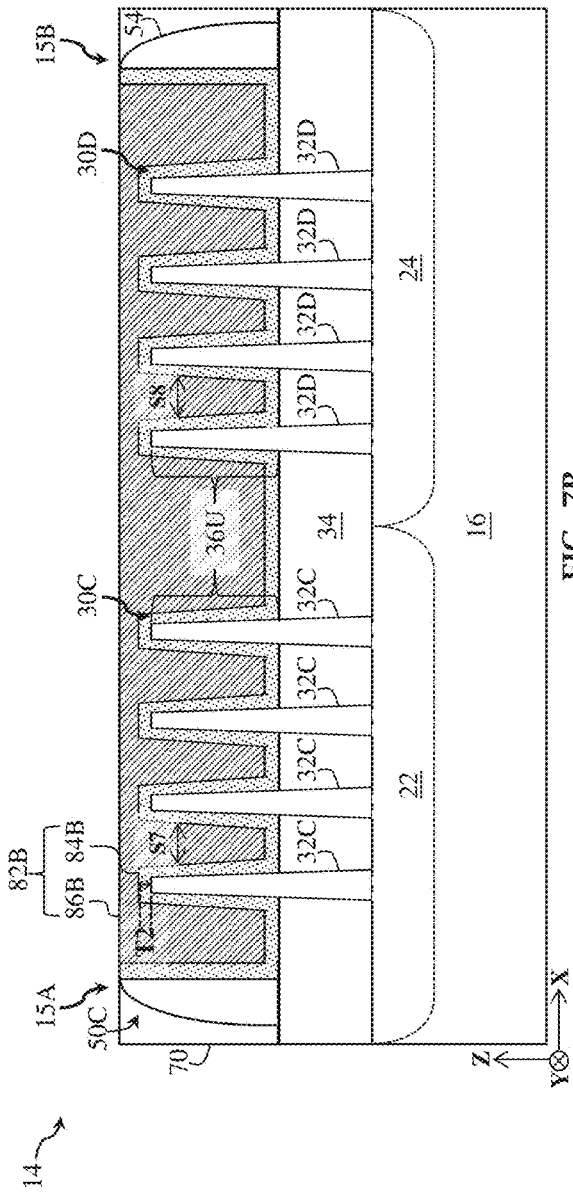
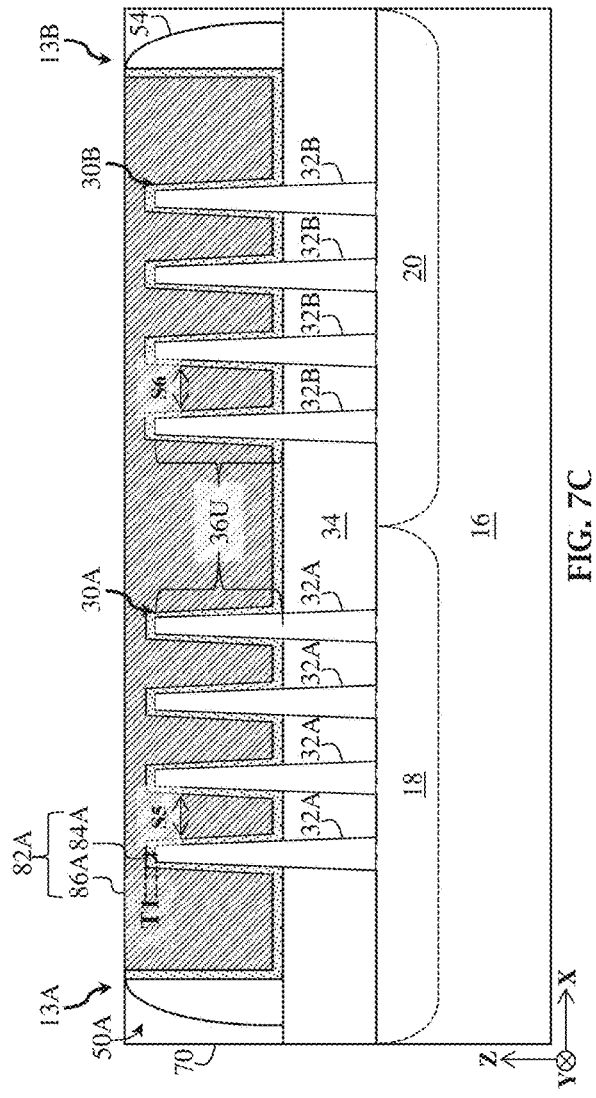
FIG. 7B
FIG. 7C

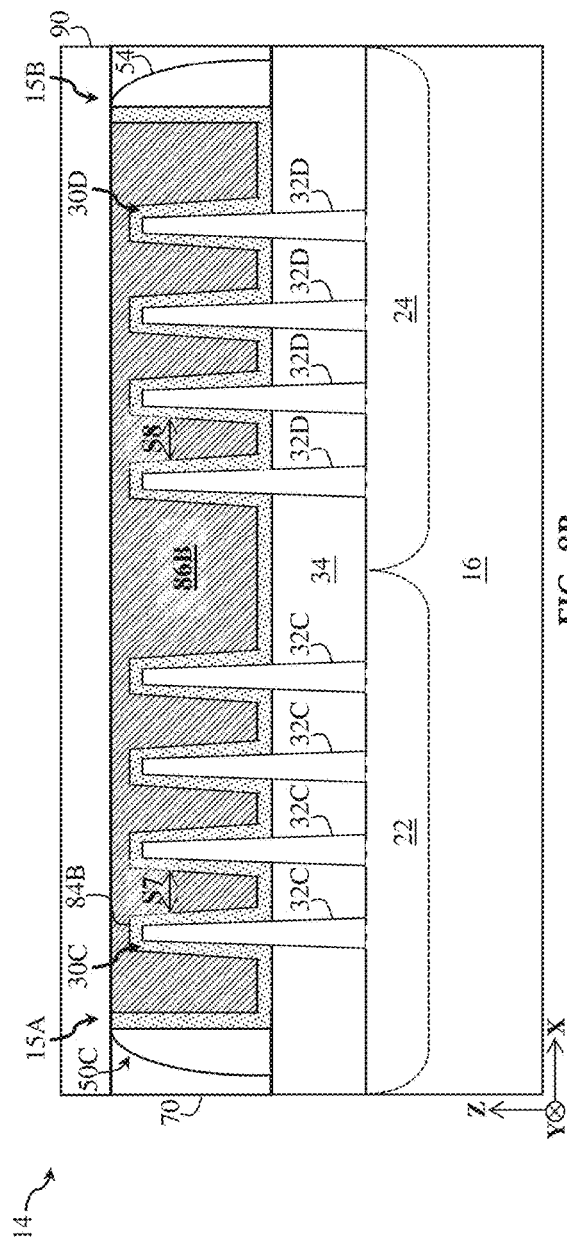
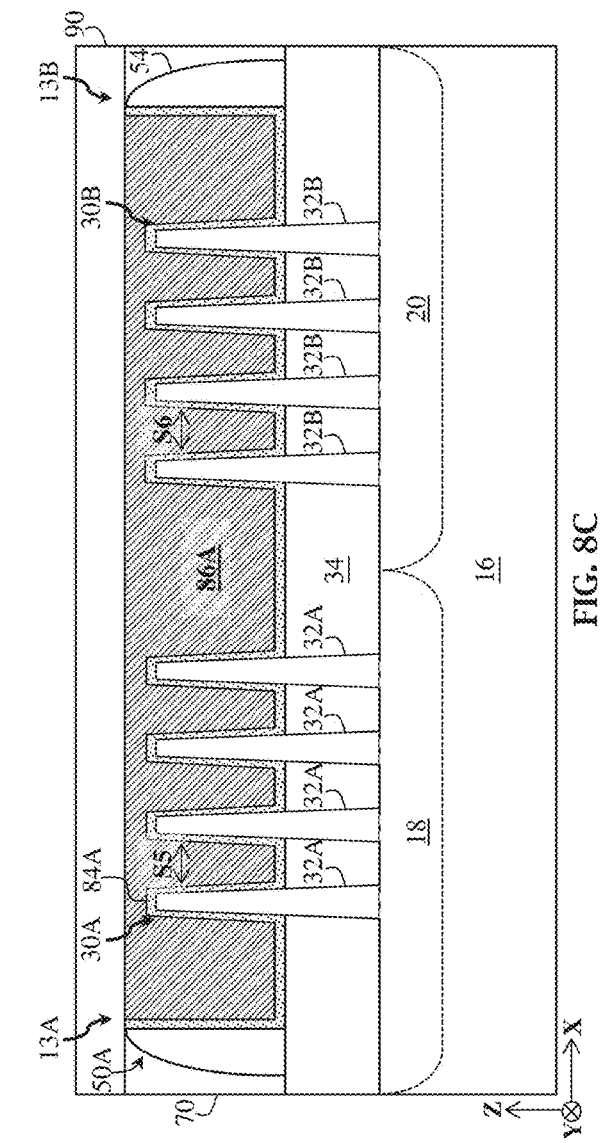
FIG. 8B
FIG. 8C

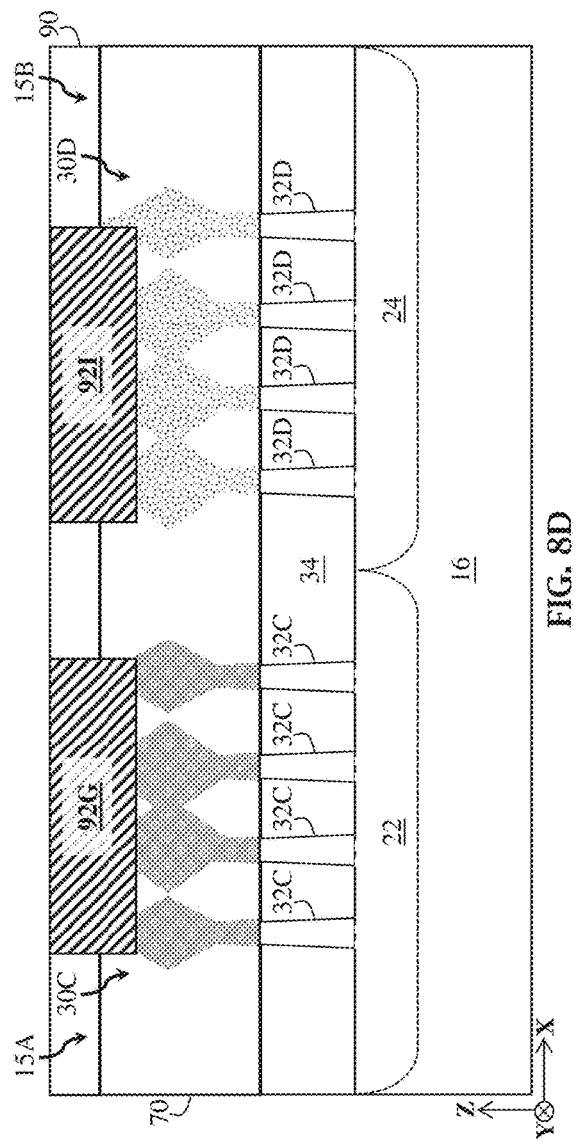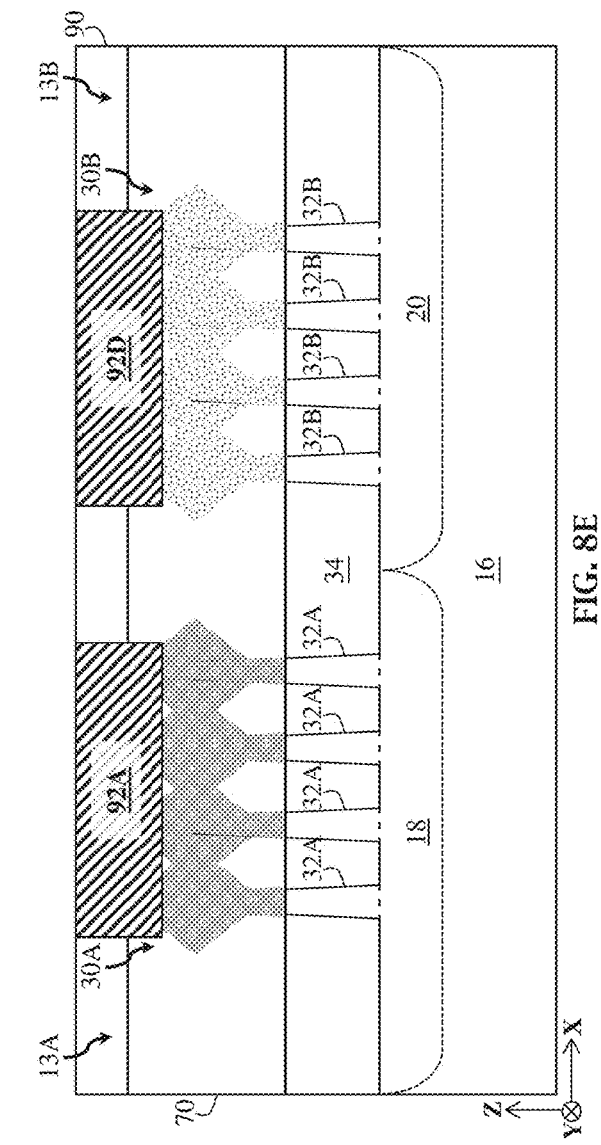

FIN AND GATE DIMENSIONS FOR OPTIMIZING GATE FORMATION

The present application is a divisional application of U.S. patent application Ser. No. 15/976,664, filed May 10, 2018, the entire disclosure of which is incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, as fin-like field effect transistor (FinFET) technologies progress towards smaller feature sizes, FinFETs configured for different operations are fabricated with substantially the same pitch to ease manufacturing, which has been observed to constrain subsequent gate formation and thus FinFET performance. Consequently, not all advantages of FinFETs can be realized.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-2C, FIGS. 3A-3C, FIGS. 4A-4C, FIGS. 5A-5C, FIGS. 6A-6C, FIGS. 7A-7C and FIGS. 8A-8E are diagrammatic views of an integrated circuit device, in portion or entirety, at various fabrication stages of a method, such as the method of FIG. 1, according to various aspects of the present disclosure.

DETAILED DESCRIPTION

Figure 1:
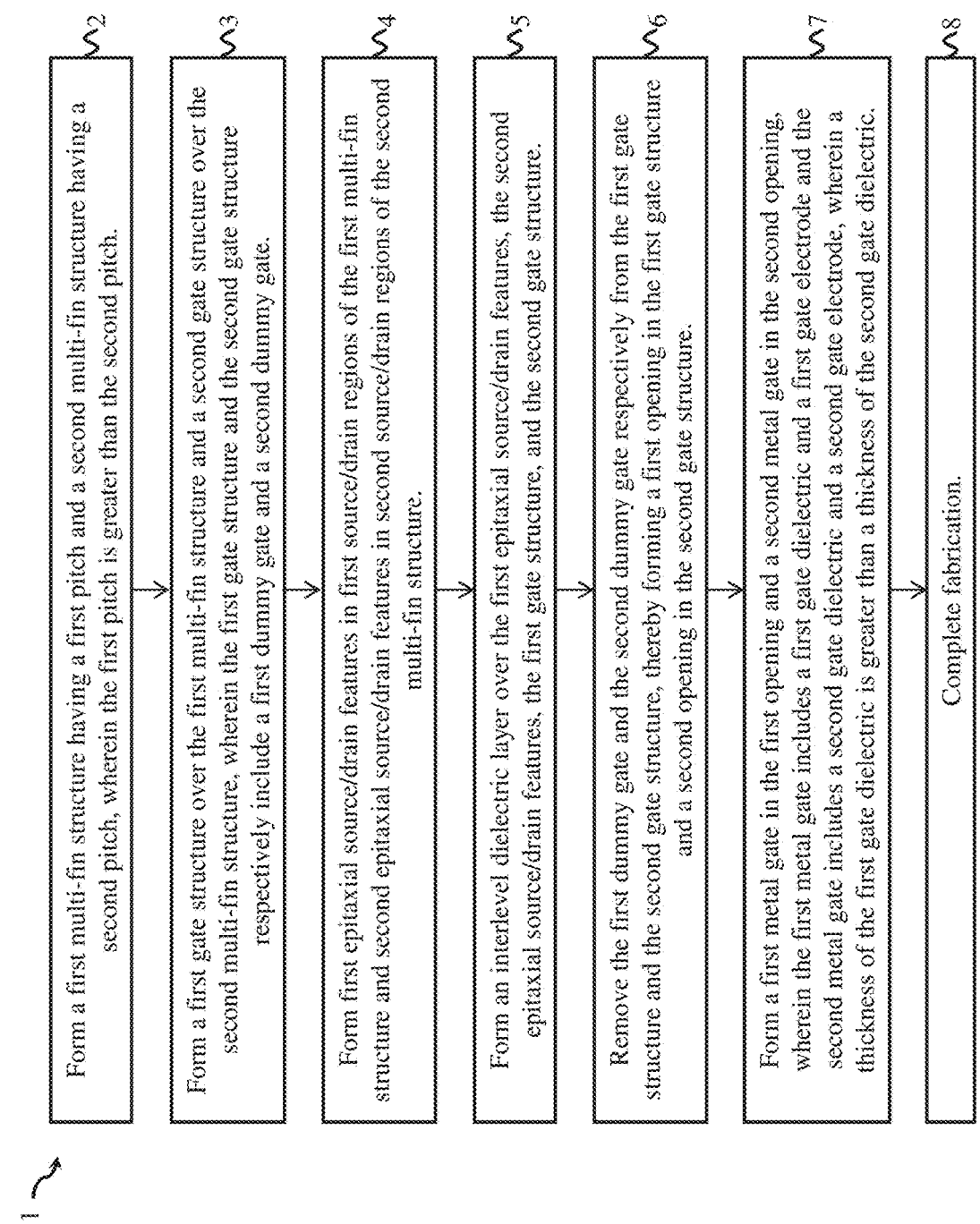
FIG. 1 is a flow chart of a method for fabricating an integrated circuit device according to various aspects of the present disclosure.

The present disclosure relates generally to integrated circuit (IC) devices, and more particularly, to fin-like field effect transistor (FinFET) devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

For advanced IC technology nodes (for example, 22 nm technology nodes and below), FinFETs (also referred to as non-planar transistors) have become a popular and promising candidate for high performance and low leakage applications. ICs typically require input/output (I/O) FinFETs that operate at high voltages (for example, greater than or equal to about 1.2 Volts (V)) and core FinFETs that operate at low voltages (for example, less than about 1.2 V). To support I/O high voltage operation, a thickness of a gate dielectric of I/O FinFETs is greater than a thickness of a gate dielectric of core FinFETs. Such gate dielectric thickness variance has been observed to negatively impact process margins and further scaling of FinFETs. For example, since I/O fins and core fins are typically fabricated with a same pitch to ease manufacturing, different gate dielectric thicknesses result in spacing between I/O fins that is less than spacing between core fins after gate dielectric formation. The narrower spacing between I/O fins presents challenges for subsequent gate electrode formation. For example, process windows for forming gate electrodes of core FinFETs are constrained by the narrower spacing between I/O fins after gate dielectric formation, constraining a range of operating voltages (threshold voltages) available for core FinFETs and I/O FinFETs. The present disclosure addresses such challenges by implementing I/O fin pitch that is different than core fin pitch. For example, IC devices disclosed herein have an I/O fin pitch that is greater than a core fin pitch, and a I/O gate dielectric thickness that is greater than a core gate dielectric thickness. A ratio of the I/O fin pitch to the core fin pitch and a ratio of the I/O gate dielectric thickness and the core gate dielectric thickness are configured to achieve spacing between I/O fins that is substantially the same as spacing between core fins after gate dielectric formation, providing common process windows for gate electrode formation for core FinFETs and I/O FinFETS.

FIG. 1 is a flow chart of a method 1 for fabricating an IC device according to various aspects of the present disclosure. At block 2, method 1 includes forming a first multi-fin structure having a first pitch and a second multi-fin structure having a second pitch. The first pitch and the second pitch are configured to optimize fin spacing for subsequent gate formation. For example, the first pitch is greater than the second pitch. In some implementations, the first multi-fin structure is a portion of an I/O FinFET of the IC device and the second multi-fin structure is a portion of a core FinFET of the IC device. In such implementations, a ratio of the first pitch to the second pitch is about 1.05 to about 1.15 in, for example, the channel regions, of the first multi-fin structure and the second multi-fin structure. Slightly increasing the first pitch (here, by about 5% to about 15% relative to the second pitch to achieve the ratio of the first pitch to the second pitch of about 1.05 to about 1.15) facilitates formation of a thicker gate dielectric that can optimize performance of the I/O FinFET while allowing sufficient process margins (for example, spacing) for formation of gate electrodes of the I/O FinFET and the core FinFET, which often include multiple layers. Such ratio also maintains minimum pitch for the core FinFET to meet high density demands of ever-shrinking IC technology nodes. In some implementations, such ratio accounts for a thickness difference in the gate dielectrics of the I/O FinFET and the core FinFET, such that after gate dielectric formation, spacing between a gate dielectric layer disposed on adjacent fins of the first multi-fin structure is substantially the same as spacing between a gate dielectric layer disposed on adjacent fins of the second multi-fin structure. It is noted that ratios greater than about 1.15 would overcompensate for any thickness difference in the gate dielectrics of the I/O FinFET and the core FinFET, causing spacing differences after gate dielectric formation that would require different process windows and further complicate formation of the gate electrodes. Furthermore, ratios greater than 1.15 would result in the first pitch, such as I/O pitch, being too large for optimizing subsequent source/drain feature formation, which can prevent sufficient merger of epitaxial source/drain features. Full non-merger of epitaxial source/drain features of the first multi-fin structure would negatively impact contact resistance ($R_c$), thereby degrading on current ($I_{on}$) performance. The ratio of about 1.05 to about 1.15 can ensure full to partial merger (and thus partial non-merger in some implementations) between epitaxial source/drain features of first multi-fin structure while compensating for gate dielectric and/or gate electrode formation issues described herein.

At block 3, method 1 includes forming a first gate structure over the first multi-fin structure and a second gate structure over the second multi-fin structure. The first gate structure includes a first dummy gate, and the second gate structure includes a second dummy gate. The first gate structure and the second gate structure respectively traverse the first multi-fin structure and the second multi-fin structure, thereby defining a first channel region disposed between first source/drain regions of the first multi-fin structure and a second channel region disposed between second source/drain regions of the second multi-fin structure. At block 4, method 1 includes forming first epitaxial source/drain features in the first source/drain regions and second epitaxial source/drain features in the second source/drain regions. At block 5, method 1 includes forming an interlevel dielectric layer over the first epitaxial source/drain features, the second epitaxial source/drain features, the first gate structure, and the second gate structure. A portion of the first gate structure and a portion of the second gate structure, such as the first dummy gate and the second dummy gate, are exposed after forming the interlevel dielectric layer. At block 6, method 1 includes removing the first dummy gate and the second dummy gate respectively from the first gate structure and the second gate structure, thereby forming a first opening in the first gate structure and a second opening in the second gate structure. The first opening and the second opening can be referred to as gate openings or gate trenches.

At block 7, method 1 includes forming a first metal gate in the first opening and a second metal gate in the second opening. The first metal gate includes a first gate dielectric and a first gate electrode, and the second metal gate includes a second gate dielectric and a second gate electrode. A thickness of the first gate dielectric is greater than a thickness of the second gate dielectric. Thicknesses of the first gate dielectric and the second gate dielectric are configured to optimize performance of devices corresponding with the first multi-fin structure and the second multi-fin structure, such as the I/O FinFET and the core FinFET, while also achieving substantially similar spacing between the first gate dielectric disposed on adjacent fins of the first multi-fin structure and between the second gate dielectric disposed on adjacent fins of the second multi-fin structure. For example, in some implementations, a ratio of the first thickness to the second thickness is about 1.3 to about 1.8. Increasing the thickness of the first gate dielectric (here, by about 30% to about 80% relative to the thickness of the second gate dielectric to achieve the ratio of about 1.3 to about 1.8) provides a thicker gate dielectric that can optimize performance of the I/O FinFET, while achieving spacing between the first gate dielectric disposed on adjacent fins of the I/O FinFET that is substantially the same as spacing between the second gate dielectric disposed on adjacent fins of the core FinFET. Having substantially the same spacing increases flexibility when forming the first gate electrode and the second gate electrode, decoupling formation of the second gate electrode from spacing between fins of the I/O FinFET, and vice versa. The increased flexibility allows greater numbers of layers, materials, and/or configurations for the first gate electrode and the second gate electrode, and thus allows a wide range of voltage thresholds for different FinFETs. Where the ratio is less than 1.3, the dual fin pitch approach described herein (for example, having a fin pitch ratio of about 1.05 to about 1.15) may not be necessary since any difference between the thicknesses of the first gate dielectric and the second gate dielectric in such implementations is minimal or negligent in negatively affecting gate electrode formation as described herein. Where the ratio is greater than 1.8, the dual-fin pitch approach described herein may not be able to compensate for such large differences between the first gate dielectric and the second gate dielectric, such that other solutions may be necessary. At block 8, method 1 can continue to complete fabrication of the IC device. For example, various contacts can be formed to the first metal gate, the second metal gate, the first epitaxial source/drain features, and/or the second epitaxial source/drain features. In some implementations, the various contacts are a portion of a multi-layer interconnect structure of the IC device. Additional steps can be provided before, during, and after method 1, and some of the steps described can be moved, replaced, or eliminated for additional embodiments of method 1.

FIGS. 2A-2C, FIGS. 3A-3C, FIGS. 4A-4C, FIGS. 5A-5C, FIGS. 6A-6C, FIGS. 7A-7C, and FIGS. 8A-8E are diagrammatic views of an IC device 10, in portion or entirety, at various fabrication stages of a method, such as method 1 of FIG. 1, according to various aspects of the present disclosure. IC device 10 includes various device regions, such as a core region (often referred to as a logic region), a memory region (such as a static random access memory (SRAM) region), an analog region, a peripheral region (often referred to as an I/O region), a dummy region, other suitable region, or combinations thereof. In the depicted embodiment, IC device 10 includes a core region 12 and an I/O region 14, each of which can include various passive and active microelectronic devices, such as resistors, capacitors, inductors, diodes, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. For example, core region 12 is configured to include a p-type fin-like field effect transistor (FinFET) 13A and an n-type FinFET 13B, such that core region 12 includes a FinFET device having complementary FinFETs. In furtherance of the example, I/O region 14 is configured to include a p-type FinFET 15A and an n-type FinFET 15B, such that I/O region 14 includes a FinFET device having complementary FinFETs. In some implementations, IC device 10 may be a portion of an IC chip, a system on chip (SoC), or portion thereof. FIGS. 2A-2C, FIGS. 3A-3C, FIGS. 4A-4C, FIGS. 5A-5C, FIGS. 6A-6C, FIGS. 7A-7C, and FIGS. 8A-8E have been simplified for the sake of clarity to better understand the inventive concepts of the present disclosure. Additional features can be added in IC device 10, and some of the features described below can be replaced, modified, or eliminated in other embodiments of IC device 10.

Figure 2A:
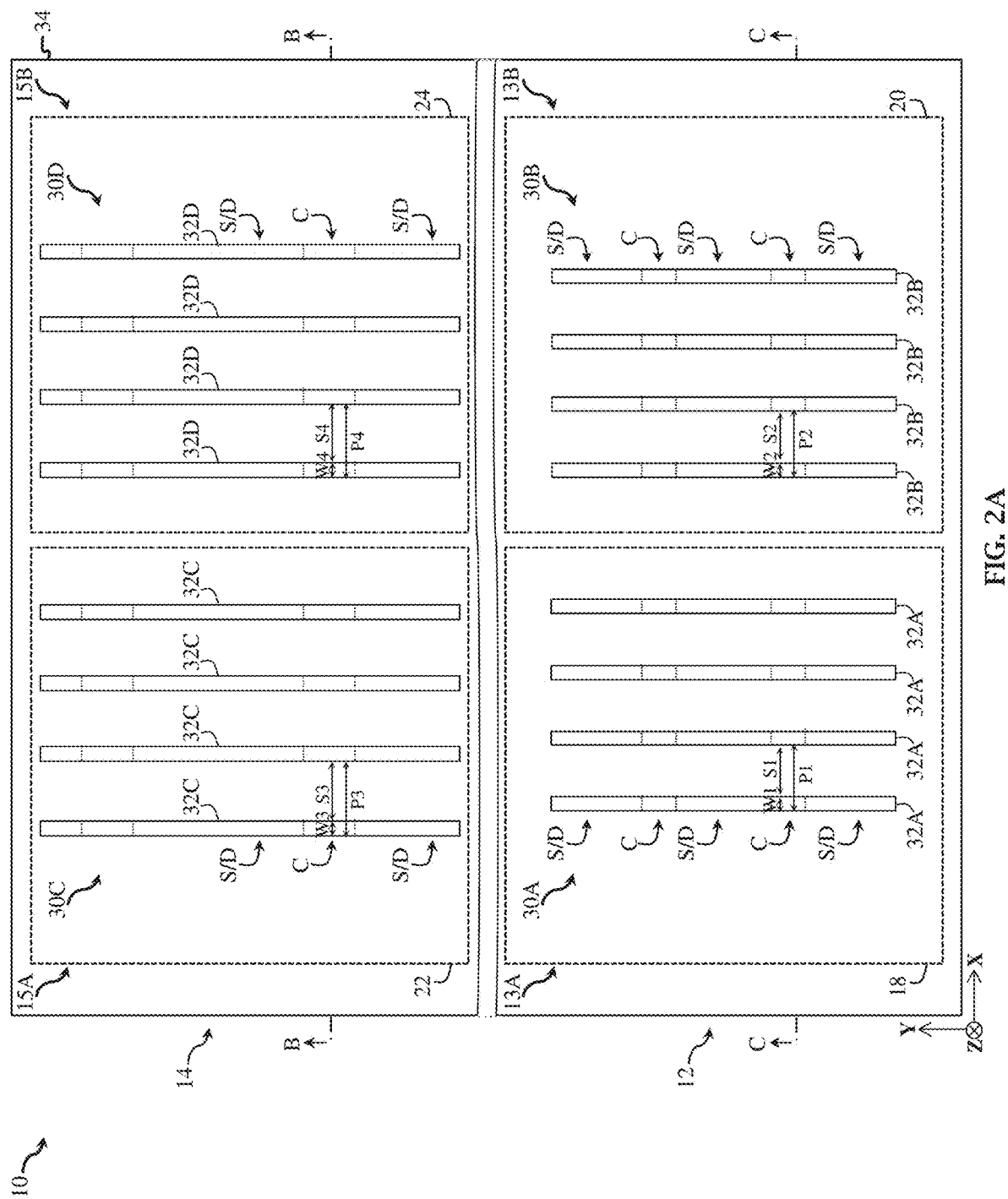

Turning to FIGS. 2A-2C, FIG. 2A is a top view of IC device 10, FIG. 2B is a fragmentary cross-sectional view of IC device 10 along line B-B of FIG. 2A, and FIG. 2C is a fragmentary cross-sectional view of IC device 10 along line C-C of FIG. 2A. In FIGS. 2A-2C, IC device 10 includes a substrate (wafer) 16. In the depicted embodiment, substrate 16 includes silicon. Alternatively or additionally, substrate 16 includes another elementary semiconductor, such as germanium; a compound semiconductor, such as silicon carbide, silicon phosphide, gallium arsenide, gallium phosphide, indium phosphide, indium arsenide, and/or indium antimonide; an alloy semiconductor, such as silicon germanium (SiGe), SiPC, GaAsP, AlInAs, AlGaAs, GaInAs, GaInP, and/or GaInAsP; or combinations thereof. Alternatively, substrate 16 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. In some implementations, substrate 16 includes one or more group III-V materials, one or more group II-IV materials, or combinations thereof depending on design requirements of IC device 10.

Substrate 16 includes various doped regions, such as a doped region 18, a doped region 20, a doped region 22, and a doped region 24, configured according to design requirements of IC device 10. In some implementations, substrate 16 includes p-type doped regions (for example, p-type wells) doped with p-type dopants, such as boron (for example, $BF_2$), indium, other p-type dopant, or combinations thereof. In some implementations, substrate 16 includes n-type doped regions (for example, n-type wells) doped with n-type dopants, such as phosphorus, arsenic, other n-type dopant, or combinations thereof. In some implementations, substrate 16 includes doped regions formed with a combination of p-type dopants and n-type dopants. In the depicted embodiment, doped region 18 is configured for p-type FinFET 13A, doped region 20 is configured for n-type FinFET 13B, doped region 22 is configured for p-type FinFET 15A, and doped region 24 is configured for n-type FinFET 15B. For example, doped region 18 and doped region 22 are n-type wells, and doped region 20 and doped region 24 are p-type wells. The various doped regions can be formed directly on and/or in substrate 16, for example, providing a p-well structure, an n-well structure, a dual-well structure, a raised structure, or combinations thereof. An ion implantation process, a diffusion process, and/or other suitable doping process can be performed to form the various doped regions.

FinFET 13A includes a fin structure 30A (having fins 32A), FinFET 13B includes a fin structure 30B (having fins 32B), FinFET 15A includes a fin structure 30C (having fins 32C), and FinFET 15B includes a fin structure 30D (having fins 32D). The present disclosure contemplates embodiments where fin structure 30A, fin structure 30B, fin structure 30C, and/or fin structure 30D include more or less fins than depicted in FIGS. 2A-2C. Fins 32A are oriented substantially parallel to one another; fins 32B are oriented substantially parallel to one another; fins 32C are oriented substantially parallel to one another; and fins 32D are oriented substantially parallel to one another. Fins 32A-32D each have a width defined in an x-direction, a length defined in a y-direction, and a height defined in a z-direction. Furthermore, fins 32A-32D each have at least one channel region (C) and at least one source/drain region (S/D) defined along their length in the y-direction, where the at least one channel region is disposed between source/drain regions. The channel region(s) includes a top portion of fins 32A-32D defined between sidewall portions of fins 32A-32D, where the top portion and the sidewall portions engage with a gate structure (as described below), such that current can flow between the source/drain regions during operation of IC device 10. The source/drain regions can also include top portions of fins 32A-32D defined between sidewall portions of fins 32A-32D. In some implementations, fins 32A-32D are a portion of substrate 16 (such as a portion of a material layer of substrate 16). For example, where substrate 16 includes silicon, fins 32A-32D include silicon. Alternatively, in some implementations, fins 32A-32D are defined in a material layer, such as one or more semiconductor material layers, overlying substrate 16. For example, fins 32A-32D can include a semiconductor layer stack having various semiconductor layers (such as a heterostructure) disposed over substrate 16. The semiconductor layers can include any suitable semiconductor materials, such as silicon, germanium, silicon germanium, other suitable semiconductor materials, or combinations thereof. The semiconductor layers can include same or different materials, etching rates, constituent atomic percentages, constituent weight percentages, thicknesses, and/or configurations depending on design requirements of IC device 10. In some implementations, the semiconductor layer stack includes alternating semiconductor layers, such as semiconductor layers composed of a first material and semiconductor layers composed of a second material. For example, the semiconductor layer stack alternates silicon layers and silicon germanium layers (for example, SiGe/Si/SiGe/Si/SiGe/Si from bottom to top). In some implementations, the semiconductor layer stack includes semiconductor layers of the same material but with alternating constituent atomic percentages, such as semiconductor layers having a constituent of a first atomic percent and semiconductor layers having the constituent of a second atomic percent. For example, the semiconductor layer stack includes silicon germanium layers having alternating silicon and/or germanium atomic percentages (for example, $Si_aGe_b$/$Si_cGe_d$/$Si_aGe_b$/$Si_cGe_d$/$Si_aGe_b$/$Si_cGe_d$ from bottom to top, where a and c are different atomic percentages of silicon and b and d are different atomic percentages of germanium). In some implementations, fins 32A, fins 32B, fins 32C, and/or fins 32D include the same or different materials and/or the same or different semiconductor layer stacks depending on design requirements of their respective FinFETs and/or region of IC device 10.

Fins 32A-32D are formed over substrate 16 using any suitable process. In some implementations, a combination of deposition, lithography and/or etching processes are performed to define fins 32A-32D extending from substrate 16 as illustrated in FIGS. 2A-2C. For example, forming fins 32A-32D includes performing a lithography process to form a patterned resist layer over substrate 16 (or a material layer, such as a heterostructure, disposed over substrate 16) and performing an etching process to transfer a pattern defined in the patterned resist layer to substrate 16 (or the material layer, such as the heterostructure, disposed over substrate 16). The lithography process can include forming a resist layer on substrate 16 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process uses the patterned resist layer as an etch mask to remove portions of substrate 16 (or a material layer disposed over substrate 16). The etching process can include a dry etching process (for example, a reactive ion etching (RIE) process), a wet etching process, other suitable etching process, or combinations thereof. After the etching process, the patterned resist layer is removed from substrate 16, for example, by a resist stripping process. Alternatively, fins 32A-32D are formed by a multiple patterning process, such as a double patterning lithography (DPL) process (for example, a lithography-etch-lithography-etch (LELE) process, a self-aligned double patterning (SADP) process, a spacer-is-dielectric patterning (SIDP) process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. Generally, double patterning processes and/or multiple patterning processes combine lithography processes and self-aligned processes, allowing patterns to be created that have, for example, pitches smaller than what is otherwise obtainable using a single, direct lithography process. For example, in some implementations, a patterned sacrificial layer is formed over a substrate using a lithography process, and spacers are formed alongside the patterned sacrificial layer using a self-aligned process. Then, the patterned sacrificial layer is removed, and the spacers can be used to pattern the substrate to form fins, such as fins 32A-32D. In some implementations, directed self-assembly (DSA) techniques are implemented while forming fins 32A-32D. Further, in some implementations, the exposure process can implement maskless lithography, electron-beam writing, ion-beam writing and/or nanoprint technology.

An isolation feature(s) 34 is formed over and/or in substrate 16 to isolate various regions, such as core region 12 and I/O region 14, of IC device 10. Isolation feature 34 further separates and isolates active device regions and/or passive device regions from each other, such as FinFET 13A, FinFET 13B, FinFET 15A, and FinFET 15B. Isolation feature 34 further separates and isolates fins from one another, such as fins 32A-32D. In the depicted embodiment, isolation feature 34 surrounds a bottom portion of fins 32A-32D, thereby defining upper fin active regions 36U of fins 32A-32D (generally referring to a portion of fins 32A-32D that extends (protrudes) from a top surface of isolation feature 34) and lower fin active regions 36L of fins 32A-32D (generally referring to a portion of fins 32A-32D that extends (protrudes) from a top surface of substrate 16 to the top surface of isolation feature 34). Isolation feature 34 includes silicon oxide, silicon nitride, silicon oxynitride, other suitable isolation material (for example, including silicon, oxygen, nitrogen, carbon, or other suitable isolation constituent), or combinations thereof. Isolation feature 34 can include different structures, such as shallow trench isolation (STI) structures, deep trench isolation (DTI) structures, and/or local oxidation of silicon (LOCOS) structures. In some implementations, STI features can be formed by etching a trench in substrate 16 (for example, by using a dry etch process and/or wet etch process) and filling the trench with insulator material (for example, by using a chemical vapor deposition process or a spin-on glass process). A chemical mechanical polishing (CMP) process may be performed to remove excessive insulator material and/or planarize a top surface of isolation feature 34. In some implementations, STI features can be formed by depositing an insulator material over substrate 16 after forming fins 32A-32D (in some implementations, such that the insulator material layer fills gaps (trenches) between fins 32A-32D) and etching back the insulator material layer to form isolation feature 34. In some implementations, isolation feature 34 includes a multi-layer structure that fills trenches, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide). In some implementations, isolation feature 34 includes a dielectric layer disposed over a doped liner layer (including, for example, boron silicate glass (BSG) or phosphosilicate glass (PSG)).

In FIGS. 2A-2C, fins 32A-32D are configured to optimize fin spacing for subsequent gate formation in core region 12 and I/O region 14. For example, I/O fin pitch (X1) defined in channel regions of I/O fins is greater than core fin pitch (X2) defined in channel regions of core fins of IC device 10. In the depicted embodiment, a pitch P1 of fin structure 30A generally refers to a sum of a width $w_1$ of fins 32A and spacing $S_1$ between adjacent fins 32A (in other words, $P_1 = w_1 + S_1$), a pitch P2 of fin structure 30B generally refers to a sum of a width $w_2$ of fins 32B and spacing $S_2$ between adjacent fins 32B (in other words, $P_2 = w_2 + S_2$), a pitch $P_3$ of fin structure 30C generally refers to a sum of a width $w_3$ of fins 32C and spacing $S_3$ between adjacent fins 32C (in other words, $P_3 = w_3 + S_3$), and a pitch $P_4$ of fin structure 30D generally refers to a sum of a width $w_4$ of fins 32D and spacing $S_4$ between adjacent fins 32D (in other words, $P_4 = w_4 + S_4$). Pitch $P_3$ is greater than pitch P1 (P3>P1), and pitch P4 is greater than pitch P2 (P4>P2), which as described further below, increases process margins for gate formation. In particular, increasing pitch in I/O region 14 in the channel region facilitates formation of thicker gate dielectrics required for optimizing device performance in I/O region 14, while allowing sufficient process margins (for example, spacing) for formation of gate electrodes that may include multiple layers (including work function layers) and minimizing pitch in core region 12 to support further scaling. In some implementations, I/O fin pitch is about 5% to about 15% greater than core fin pitch. For example, a ratio of I/O fin pitch to a ratio of core fin pitch (generally referred to as a fin pitch ratio) is about 1.05 to about 1.15 (in other words, 1.05<X1/X2<1.15), such that a ratio of $P_3$ to $P_1$ is 1.05<$P_3$/$P_1$<1.15 and/or a ratio of $P_4$ to $P_2$ is 1.05<$P_4$/$P_2$<1.15. In some implementations, I/O fin pitch, such as $P_3$ and/or $P_4$, is less than or equal to about 30 nm, and core fin pitch, such as $P_1$ and/or $P_2$, is less than or equal to about 28 nm. In some implementations, I/O fin pitch, such as $P_3$ and/or $P_4$, is less than or equal to about 28 nm, and core fin pitch, such as $P_1$ and/or $P_2$, is less than or equal to about 26 nm. In some implementations, configuring the I/O fin pitch and the core fin pitch to less than about 30 nm with the fin pitch ratios described here can be implemented to meet demands of advanced IC technology nodes. In some implementations, fins in core region 12 have substantially the same pitch (for example, $P_1 \approx P_2$), and fins in I/O region 14 have substantially the same pitch (for example, $P_3 \approx P_4$). In some implementations, fins in core region 12 have substantially the same width (for example, $w_1 \approx w_2$), and fins in I/O region 14 have substantially the same width (for example, $w_3 \approx w_4$). In some implementations, widths of fins 32C and/or fins 32D in I/O region 14 (here, $w_3$ and $w_4$) are less than widths of fins 32A and/or fins 32B in core region 12 (here, $w_1$ and $w_2$). To optimize subsequent gate formation, it is noted that pitches $P_1$-$P_4$, widths $w_1$-$w_4$, and spacings $S_1$-$S_4$ are for the channel regions of fin structures 30A-30D.

The present disclosure contemplates variations in heights, widths, and/or lengths of fins 32A-32D that may arise from processing and fabrication of IC device 10. In the depicted embodiment, fins 32A-32D have tapered widths along their respective heights, where widths $w_1$-$w_4$ decrease along the heights of fins 32A-32D. In the depicted embodiment, widths $w_1$-$w_4$ each represent an average of a varying width of respective top portions T of upper fin active regions 36U of fins 32A-32D. In such implementations, widths decrease from boundaries designating top portions T of upper fin active regions 36U to a top surface of fins 32A-32D, such that widths $w_1$-$w_4$ each represent an average of the decreasing widths of top portions T of upper fin active regions 36U along their heights. In some implementations, top portions T of upper fin active regions 36U are about 5 nm of fins 32A-32D. In some implementations, widths $w_1$-$w_4$ each represent an average of a varying width of respective upper fin active regions 36U. In such implementations, widths decrease from a top surface of isolation feature 34 to a top surface of fins 32A-32D, such that widths $w_1$-$w_4$ each represent an average of the decreasing widths of upper fin active regions 36U along their heights. In some implementations, widths $w_1$-$w_4$ each represent an average of a varying width of an entirety of respective fins 32A-32D. In such implementations, widths decrease from a top surface of substrate 16 to a top surface of fins 32A-32D, such that widths $w_1$-$w_4$ each represent an average of the decreasing widths of fins 32A-32D along their heights. In some implementations, widths $w_1$-$w_4$ can vary from about 5 nm to about 15 nm along fins 32A-32D depending on where widths $w_1$-$w_4$ are measured along heights of fins 32A-32D. In some implementations, fin width varies depending on a position of a fin relative to other fins and/or relative to other features of IC device 10. For example, widths of center fins (in the depicted embodiment, fin structures 30A-30D each include two center fins) is greater than widths of edge fins (here, a leftmost fin and a rightmost fin enclosing the two center fins of fin structures 30A-30D). In another example, alternatively, widths of the center fins are less than widths of the edge fins. In furtherance of such implementations, respective widths of the edge fins and the center fins can represent respective average widths of the edge fins and the center fins in any manner as described herein. Though fins 32A-32D are depicted as having tapered widths, in some implementations, fins 32A-32D have substantially the same widths along their respective heights.

In some implementations, a pattern defined in a patterned resist layer (or patterned mask layer) includes first openings having a first width for defining fins 32A, 32B and second openings having a second width for defining fins 32C, 32D, where the first width is greater than the second width. In such implementations, an etching process then uses the patterned resist layer as an etch mask to remove portions of substrate 16 (or a material layer disposed over substrate 16), such that fins 32A-32D are fabricated having pitches $P_1$-$P_4$ as described herein. In some implementations, a pattern defined in the patterned resist layer (or patterned mask layer) includes openings for defining fins 32A-32D, where the openings have substantially the same width. In such implementations, an etching process then uses the patterned resist layer as an etch mask to remove portions of substrate 16 (or a material layer disposed over substrate 16), such that fins 32A-32D have the same width. In furtherance of such implementations, a trimming process is then performed to trim fin structures 30C, 30D, thereby reducing a width of fins 32C, 32D, such that the width of fins 32C, 32D is less than a width of fins 32A, 32B. The trimming process implements any suitable process for reducing the dimension of fins 32C, 32D. For example, in some implementations, the trimming process includes an etching process that can selectively etch fins 32C, 32D relative to other features of IC device 10. The etching process is a dry etching process, a wet etching process, or combinations thereof. In some implementations, a wet etching process implements an etching solution that includes ammonium hydroxide ($NH_4OH$), hydrogen peroxide ($H_2O_2$), sulfuric acid ($H_2SO_4$), tetramethylammonium hydroxide (TMAH), other suitable wet etching solution, or combinations thereof. For example, the wet etching solution can utilize an $NH_4OH$:$H_2O_2$ solution, an $NH_4OH$:$H_2O_2$:$H_2O$ solution (known as an ammonia-peroxide mixture (APM)), or an $H_2SO_4$:$H_2O_2$ solution (known as a sulfuric peroxide mixture (SPM)). In some implementations, a dry etching process implements an etchant gas that includes a fluorine-containing etchant gas (for example, $CF_4$, $SF_6$, $CH_2F_2$, $CHF_3$, and/or $C_2F_6$), an oxygen-containing gas, a chlorine-containing gas (for example, $Cl_2$, $CHCl_3$, $CCl_4$, and/or $BCl_3$), a bromine-containing gas (for example, HBr and/or $CHBR_3$), an iodine-containing gas, other suitable gases and/or plasmas, or combinations thereof. In some implementations, the trimming process implements an oxidation process. For example, the trimming process can expose fins 32C, 32D to an ozone environment, thereby oxidizing a portion of fins 32C, 32D, which is subsequently removed by a cleaning process and/or an etching process.

Figure 3A:
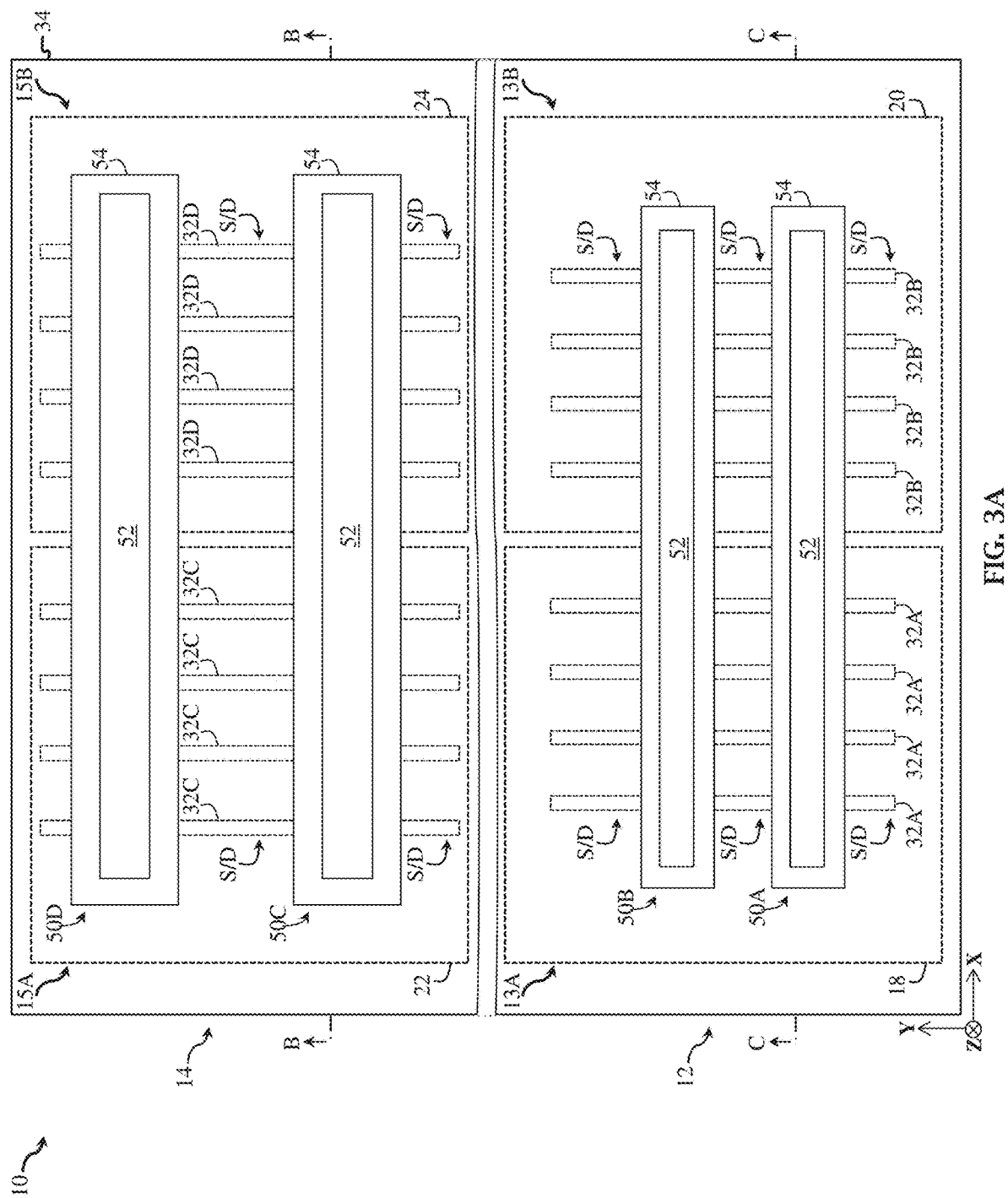

Turning to FIGS. 3A-3C, FIG. 3A is a top view of IC device 10, FIG. 3B is a fragmentary cross-sectional view of IC device 10 along line B-B of FIG. 3A, and FIG. 3C is a fragmentary cross-sectional view of IC device 10 along line 3C-3C of FIG. 3A. In FIGS. 3A-3C, various gate structures are formed over fins 32A-32D, such as a gate structure 50A, a gate structure 50B, a gate structure 50C, and a gate structure 50D. Gate structures 50A-50D extend along the x-direction (for example, substantially perpendicular to fins 32A-32D) and traverse respective fin structures 30A-30D, such that gate structures 50A-50D wrap upper fin active regions 36U of respective fins 32A-32D. In the depicted embodiment, gate structure 50A and gate structure 50B are disposed over respective channel regions of fins 32A, 32B, and gate structure 50C is disposed over respective channel regions of fins 32C, 32D. Gate structures 50A, 50B wrap the respective channel regions of fins 32A, 32B, thereby interposing respective source/drain regions of fins 32A, 32B. Gate structures 50A, 50B engage the respective channel regions of fins 32A, 32B, such that current can flow between the respective source/drain regions of fins 32A, 32B during operation. Gate structure 50C wraps the respective channel regions of fins 32C, 32D, thereby interposing respective source/drain regions of fins 32C, 32D. In furtherance of the depicted embodiment, gate structure 50D wraps portions of fins 32C, 32D, positioned such that a source/drain region of fins 32C, 32D is disposed between gate structure 50D and gate structure 50C. In some implementations, gate structures 50A-50C are active gate structures, whereas gate structure 50D is a dummy gate structure. "Active gate structure" generally refers to an electrically functional gate structure of IC device 10, whereas "dummy gate structure" generally refers to an electrically non-functional gate structure of IC device 10. In some implementations, a dummy gate structure mimics physical properties of an active gate structure, such as physical dimensions of the active gate structure, yet is inoperable (in other words, does not enable current to flow). In some implementations, gate structure 50D enables a substantially uniform processing environment, for example, enabling uniform epitaxial material growth in source/drain regions of fins 32C, 32D (for example, when forming epitaxial source/drain features), uniform etch rates in source/drain regions of fins 32C, 32D (for example, when forming source/drain recesses), and/or uniform, substantially planar surfaces (for example, by reducing (or preventing) CMP-induced dishing effects). In some implementations, IC device 10 is configured such that gate structure 50D is an active gate structure and/or gate structure 50A, gate structure 50B, and/or gate structure 50C are dummy gate structures.

Gate structures 50A-50D include gate stacks configured to achieve desired functionality according to design requirements of IC device 10, such that gate structures 50A-50D include the same or different layers and/or materials. Gate structures 50A-50D are fabricated according to a gate last process, such that gate structures 50A-50D have dummy gates 52 in FIGS. 3A-3C, which are subsequently replaced with metal gates. Dummy gates 52 include, for example, an interfacial layer (including, for example, silicon oxide) and a dummy gate electrode (including, for example, polysilicon). In some implementations, dummy gates 52 include a dummy gate dielectric disposed between the dummy gate electrode and the interfacial layer. The dummy gate dielectric includes a dielectric material, such as silicon oxide, a high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$), other suitable high-k dielectric materials, or combinations thereof. Dummy gates 52 can include numerous other layers, for example, capping layers, interface layers, diffusion layers, barrier layers, hard mask layers, or combinations thereof. Dummy gates 52 are formed by deposition processes, lithography processes, etching processes, other suitable processes, or combinations thereof. For example, a deposition process is performed to form a dummy gate electrode layer over substrate 16, particularly over fins 32A-32D and isolation feature 34. In some implementations, a deposition process is performed to form a dummy gate dielectric layer over fins 32A-32D before forming the dummy gate electrode layer, where the dummy gate electrode layer is formed over the dummy gate dielectric layer. The deposition process includes CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. A lithography patterning and etching process is then performed to pattern the dummy gate electrode layer (and, in some implementations, the dummy gate dielectric layer) to form dummy gates 52, such that dummy gates 52 wrap fins 32A-32D as depicted. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposing process is assisted, implemented, or replaced by other methods, such as maskless lithography, electron-beam writing, or ion-beam writing. In yet another alternative, the lithography patterning process implements nanoimprint technology. The etching processes include dry etching processes, wet etching processes, other etching methods, or combinations thereof.

Gate structures 50A-50D further include respective gate spacers 54 disposed adjacent to (for example, along sidewalls of) dummy gates 52. Gate spacers 54 are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over substrate 16 and subsequently anisotropically etched to form gate spacers 54. In some implementations, gate spacers 54 include a multi-layer structure, such as a first dielectric layer that includes silicon nitride and a second dielectric layer that includes silicon oxide. In some implementations, gate spacers 54 include more than one set of spacers, such as seal spacers, offset spacers, sacrificial spacers, dummy spacers, and/or main spacers, formed adjacent to the gate stacks. In such implementations, the various sets of spacers can include materials having different etch rates. For example, a first dielectric layer including silicon and oxygen can be deposited over substrate 16 and subsequently anisotropically etched to form a first spacer set adjacent to the gate stacks, and a second dielectric layer including silicon and nitrogen can be deposited over substrate 16 and subsequently anisotropically etched to form a second spacer set adjacent to the first spacer set. Implantation, diffusion, and/or annealing processes may be performed to form lightly doped source and drain (LDD) features and/or heavily doped source and drain (HDD) features (both of which are not shown in FIGS. 3A-3C) in source/drain regions of fins 32A-32D before and/or after forming gate spacers 54.

Figure 4A:
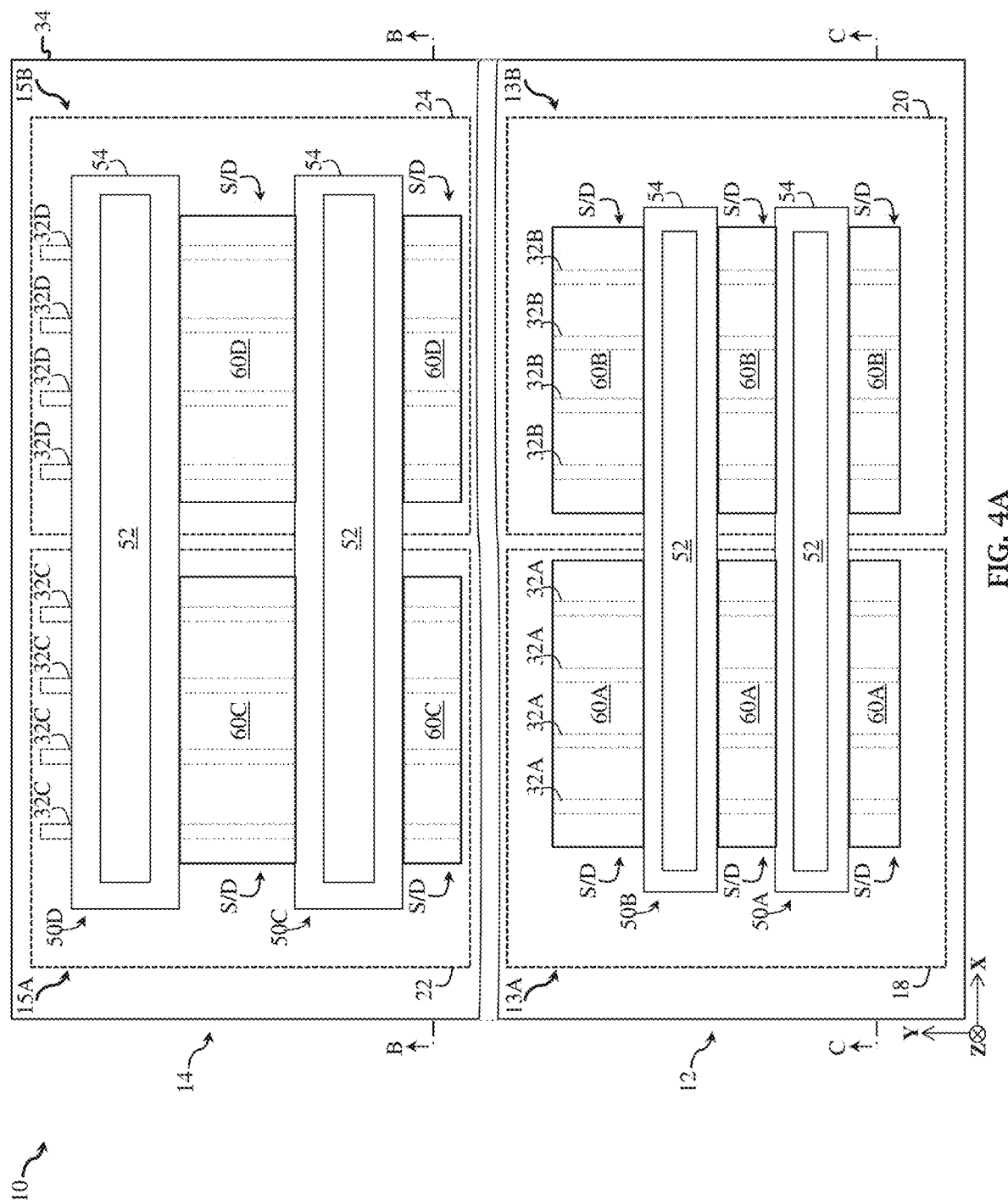

Turning to FIGS. 4A-4C, FIG. 4A is a top view of IC device 10, FIG. 4B is a fragmentary cross-sectional view of IC device 10 along line B-B of FIG. 4A, and FIG. 4C is a fragmentary cross-sectional view of IC device 10 along line C-C of FIG. 4A. In FIGS. 4A-4C, source features and drain features (referred to as source/drain features) are formed in source/drain regions of fins 32A-32D. For example, semiconductor material is epitaxially grown on fins 32A-32D, forming epitaxial source/drain features 60A on fins 32A, epitaxial source/drain features 60B on fins 32B, epitaxial source/drain features 60C on fins 32C, and epitaxial source/drain features 60D on fins 32D. In the depicted embodiment, a fin recess process (for example, an etch back process) is performed on source/drain regions of fins 32A-32D, such that epitaxial source/drain features 60A-60D are grown from lower fin active regions 36L of fins 32A-32D. In some implementations, source/drain regions of fins 32A-32D are not subjected to a fin recess process, such that epitaxial source/drain features 60A-60D are grown from and wrap at least a portion of upper fin active regions 36U of fins 32A-32D. In furtherance of the depicted embodiment, epitaxial source/drain features 60A-60D extend (grow) laterally along the x-direction (in some implementations, substantially perpendicular to fins 32A-32D), such that epitaxial source/drain features 60A-60D are merged epitaxial source/drain features that span more than one fin (for example, epitaxial source/drain feature 60A spans fins 32A, epitaxial source/drain feature 60B spans fins 32B, epitaxial source/drain feature 60C spans fins 32C, and epitaxial source/drain feature 60D spans fins 32D). Since a pitch of fin structures in I/O region 14 is greater than a pitch of fin structures in core region 12, epitaxial source/drain features in I/O region 14 may be partially merged, instead of fully merged. For example, in FIG. 4C, epitaxial source/drain features 60A, 60B are fully merged, such that epitaxial source/drain feature 60A spans fins 32A without interruption (or gaps) between epitaxial material grown from adjacent fins 32A and epitaxial source/drain feature 60B spans fins 32B without interruption (or gaps) between epitaxial material grown from adjacent fins 32B. In contrast, in FIG. 4B, epitaxial source/drain features 60C, 60D are partially merged, such that epitaxial source/drain feature 60C spans fins 32C with interruption (or gaps G) between epitaxial material grown from adjacent fins 32C and epitaxial source/drain feature 60D spans fins 32D with interruption (or gaps G) between epitaxial material grown from adjacent fins 32D.

An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of substrate 16 and/or fins 32A-32D. Epitaxial source/drain features 60A-60D are doped with n-type dopants and/or p-type dopants. For example, for FinFET 13A and FinFET 15A, epitaxial source/drain features 60A and epitaxial source/drain features 60C are epitaxial layers including silicon and/or germanium, where the silicon germanium containing epitaxial layers are doped with boron, carbon, other p-type dopant, or combinations thereof (for example, forming a Si:Ge:B epitaxial layer or a Si:Ge:C epitaxial layer). In furtherance of the example, for FinFET 13B and FinFET 15B, epitaxial source/drain features 60B and epitaxial source/drain features 60D are epitaxial layers including silicon and/or carbon, where silicon-containing epitaxial layers or silicon-carbon-containing epitaxial layers are doped with phosphorous, arsenic, other n-type dopant, or combinations thereof (for example, forming a Si:P epitaxial layer, a Si:C epitaxial layer, or a Si:C:P epitaxial layer). It is noted that, in FIG. 3A, epitaxial source/drain features 60A-60D are depicted as oxide definition (OD) regions, such that epitaxial source/drain features 60A, 60C can alternatively be referred to as P+OD regions and epitaxial source/drain features 60B, 60D can alternatively be referred to as N+OD regions. In some implementations, epitaxial source/drain features 60A-60D include materials and/or dopants that achieve desired tensile stress and/or compressive stress in the channel regions. In some implementations, epitaxial source/drain features 60A-60D are doped during deposition by adding impurities to a source material of the epitaxy process. In some implementations, epitaxial source/drain features 60A-60D are doped by an ion implantation process subsequent to a deposition process. In some implementations, annealing processes are performed to activate dopants in epitaxial source/drain features 60A-60D and/or other source/drain features of IC device 10, such as HDD regions and/or LDD regions (both of which are not shown in FIGS. 4A-4C).

Figure 5A:
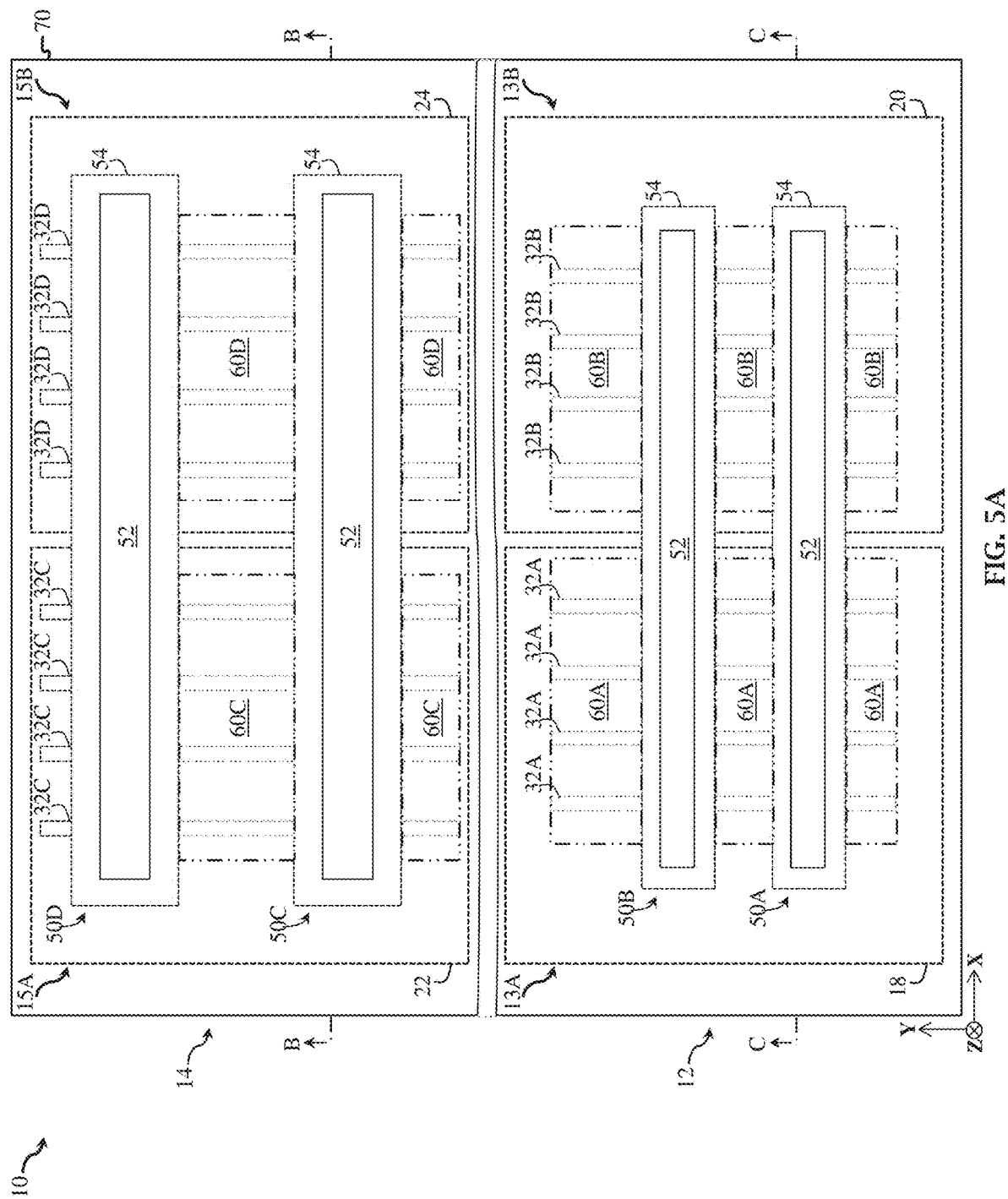

Turning to FIGS. 5A-5C, FIG. 5A is a top view of IC device 10, FIG. 5B is a fragmentary cross-sectional view of IC device 10 along line B-B of FIG. 5A, and FIG. 5C is a fragmentary cross-sectional view of IC device 10 along line C-C of FIG. 5A. In FIGS. 5A-5C, an interlevel dielectric (ILD) layer 70 is formed over substrate 16, particularly over epitaxial source/drain features 60A-60D, gate structures 50A-50D, and fins 32A-32D. In some implementations, ILD layer 70 is a portion of a multilayer interconnect (MLI) feature that electrically couples various devices (for example, transistors, resistors, capacitors, and/or inductors) and/or components (for example, gate structures and/or source/drain features) of IC device 10, such that the various devices and/or components can operate as specified by design requirements of IC device 10. ILD layer 70 includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric material, or combinations thereof. In some implementations, ILD layer 70 has a multilayer structure having multiple dielectric materials. In some implementations, a contact etch stop layer (CESL) is disposed between ILD layer 70 and epitaxial source/drain features 60A-60D, fins 32A-32D, and/or gate structures 50A-50D. The CESL includes a material different than ILD layer 70, such as a dielectric material that is different than the dielectric material of ILD layer 70. In the depicted embodiment, where ILD layer 70 includes a low-k dielectric material, the CESL includes silicon and nitrogen (for example, silicon nitride or silicon oxynitride). ILD layer 70 and/or the CESL is formed over substrate 16, for example, by a deposition process (such as CVD, PVD, ALD, HDPCVD, MOCVD, RPCVD, PECVD, LPCVD, ALCVD, APCVD, plating, other suitable methods, or combinations thereof). In some implementations, ILD layer 70 and/or the CESL are formed by a flowable CVD (FCVD) process that includes, for example, depositing a flowable material (such as a liquid compound) over substrate 16 and converting the flowable material to a solid material by a suitable technique, such as thermal annealing and/or ultraviolet radiation treating. Subsequent to the deposition of ILD layer 70 and/or the CESL, a CMP process and/or other planarization process is performed, such that a top portion of gate structures 50A-50D is reached (exposed). In the depicted embodiment, the CMP process and/or planarization process is performed until reaching (exposing) dummy gates 52.

Figure 6A:
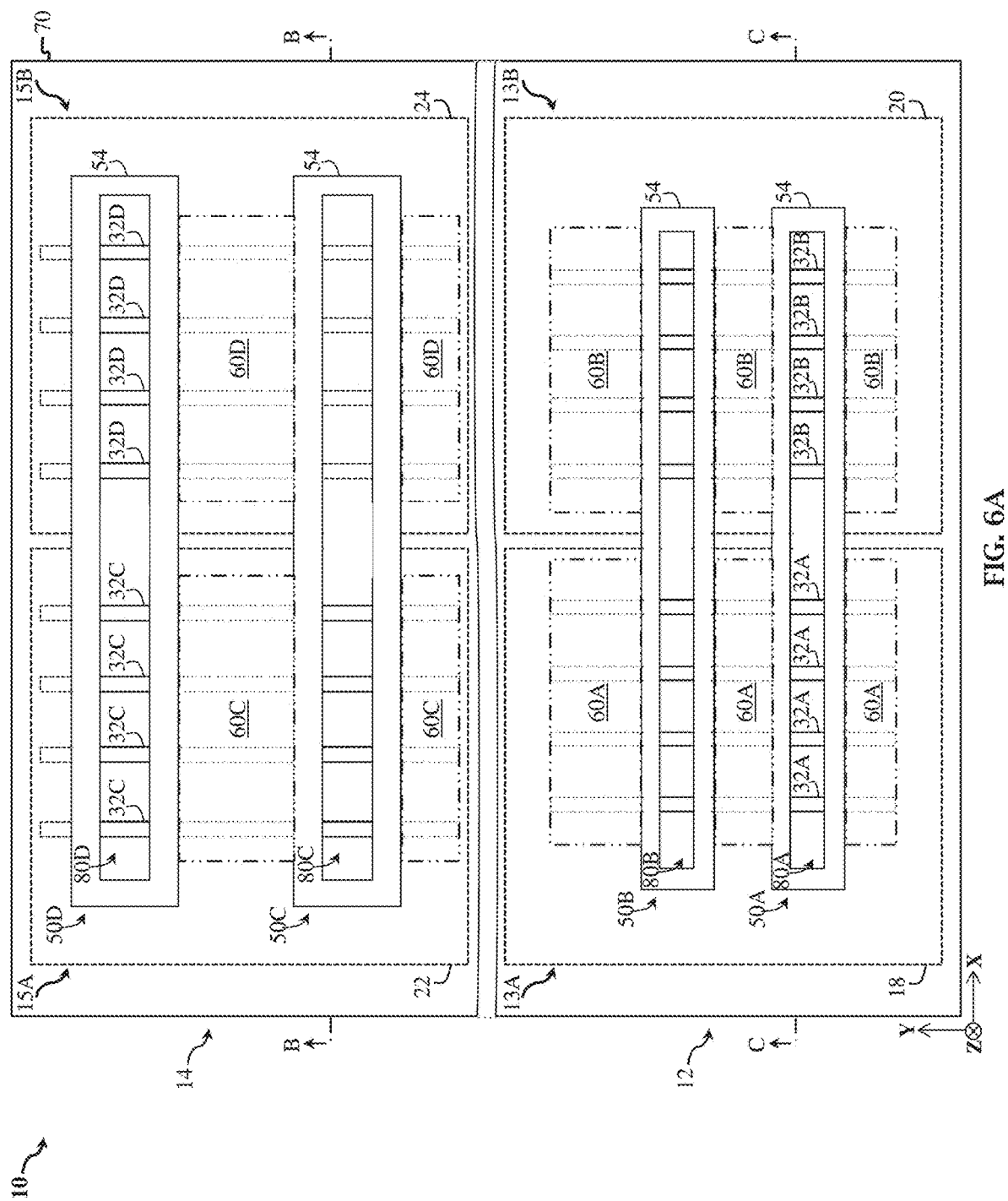
Figure 7A:
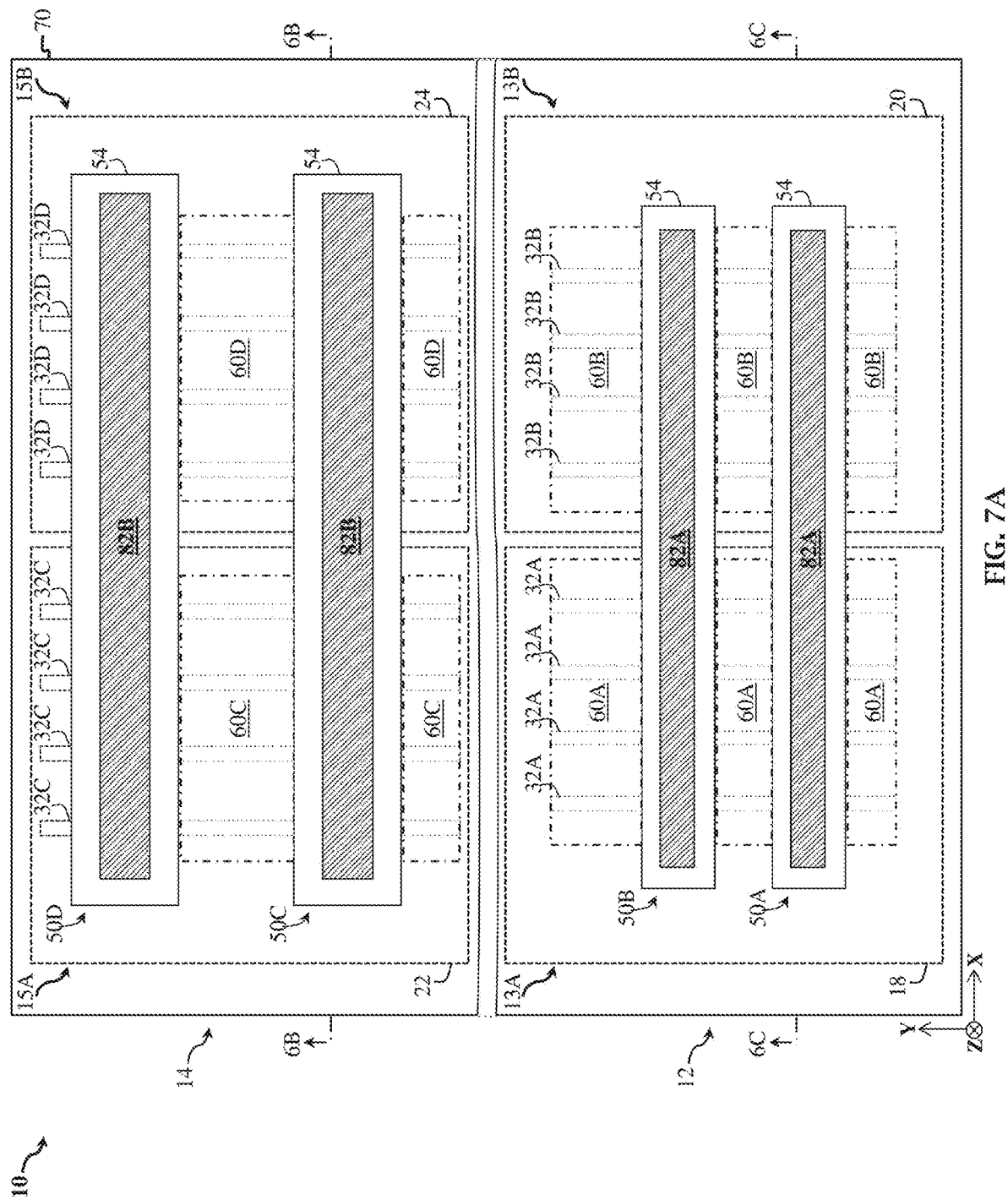

Turning to FIGS. 6A-6C, FIG. 6A is a top view of IC device 10, FIG. 6B is a fragmentary cross-sectional view of IC device 10 along line B-B of FIG. 6A, and FIG. 6C is a fragmentary cross-sectional view of IC device 10 along line C-C of FIG. 6A. In FIGS. 6A-6C, dummy gates 52 of gate structures 50A-50D are removed to form a trench (opening) 80A in gate structure 50A, a trench 80B in gate structure 50B, a trench 80C in gate structure 50C, and a trench 80D in gate structure 50D. Trenches 80A-80D expose upper fin active regions 36U of fins 32A-32D. In some implementations, a portion of dummy gates 52 is removed, such that trenches 80A-80D expose an interfacial layer and/or a gate dielectric (and, in some implementations, a dummy gate dielectric) of the dummy gates 52. The etching process is a dry etching process, a wet etching process, or combinations thereof. In some implementations, an etching process selectively removes dummy gates 52 without (or minimally) removing ILD layer 70, gate spacers 54, isolation feature 34, fins 32A-32D, and/or other features of IC device 10. In some implementations, a selective etching process can be tuned, such that a dummy gate electrode layer (including, for example, polysilicon) has an adequate etch rate relative to an interfacial layer and/or a dummy gate dielectric of dummy gates 52, gate spacers 54, ILD layer 70, and/or other feature of IC device 10. In some implementations, dummy gates 52 of at least one of gate structures 50A-50D is replaced with a metal gate, while dummy gates 52 of at least one of gate structures 50A-50D remains (in other words, is not replaced), such that a trench may not be formed in all of gate structures 50A-50D Turning to FIGS. 7A-7C, FIG. 7A is a top view of IC device 10, FIG. 7B is a fragmentary cross-sectional view of IC device 10 along line B-B of FIG. 7A, and FIG. 7C is a fragmentary cross-sectional view of IC device 10 along line C-C of FIG. 7A. In FIGS. 7A-7C, metal gates are formed in trenches 80A-80D. In the depicted embodiment, metal gates 82A are formed in trenches 80A, 80B of gate structures 50A, 50B, and metal gates 82B are formed in trenches 80C, 80D of gate structures 50C, 50D. Metal gates 82A, 82B are configured to achieve desired functionality according to design requirements of IC device 10, such that gate structures 50A-50G include the same or different layers and/or materials. In the depicted embodiment, metal gates 82A include a gate dielectric 84A and a gate electrode 86A, and metal gates 82B include a gate dielectric 84B and a gate electrode 86B. Since gate structures 50A, 50B span p-type FinFET 13A and n-type FinFET 13B, the present disclosure contemplates that gate structures 50A, 50B can include different layers in regions corresponding with p-type FinFET 13A and n-type FinFET 13B. For example, a number, configuration, and/or materials of layers of gate dielectric 84A and/or gate electrode 86A disposed over doped region 18 corresponding with FinFET 13A may be different than a number, configuration, and/or materials of layers of gate dielectric 84A and/or gate electrode 86A disposed over doped region 20 corresponding with FinFET 13B. Since gate structures 50C, 50D span p-type FinFET 15A and n-type FinFET 15B, the present disclosure further contemplates that gate structures 50C, 50D can include different layers in regions corresponding with p-type FinFET 15A and n-type FinFET 15B. For example, a number, configuration, and/or materials of layers of gate dielectric 84B and/or gate electrode 86B disposed over doped region 22 corresponding with FinFET 15A may be different than a number, configuration, and/or materials of layers of gate dielectric 84B and/or gate electrode 86B disposed over doped region 24 corresponding with FinFET 15B.

Gate dielectric 84A wraps upper fin active regions 36U of fins 32A and fins 32B, and gate dielectric 84B wraps upper fin active regions 36U of fins 32C and fins 32D. In the depicted embodiment, gate dielectric 84A is conformally disposed over fins 32A, 32B and isolation feature 34, such that gate dielectric 84A has a substantially uniform thickness T1. In furtherance of the depicted embodiment, gate dielectric 84B is conformally disposed over fins 32C, 32D and isolation feature 34, such that gate dielectric 84B has a substantially uniform thickness T2. To support I/O high voltage operation, a thickness of gate dielectrics of I/O FinFETs is greater than a thickness of a gate dielectric of core FinFETs. For example, in furtherance of the depicted embodiment, T2 of gate dielectric 84B is greater than T1 of gate dielectric 84A (T2>T1). In some implementations, T2 is about 30% greater than T1. In some implementations, a ratio of T2 to T1 is greater than about 1.3 (in other words, T2/T1≥1.3). In the depicted embodiment, a ratio of T2 to T1 is about 1.3 to about 1.8 (in other words, 1.8≥T2/T1≥1.3). Pitches (here, $P_1$-$P_4$) and gate dielectric thicknesses (here, T1 and T2) of core region 12 and I/O region 14 are configured to achieve spacing between gate dielectric disposed on adjacent fins in core region 12 (here, spacing S5 and/or spacing S6) that is substantially the same as spacing between gate dielectric disposed on adjacent fins in I/O region 14 (here, spacing S7 and/or spacing S8). For example, in the depicted embodiment, spacing S5 between gate dielectric 84A disposed on adjacent fins 32A is substantially the same as spacing S7 between gate dielectric 84B disposed on adjacent fins 32C (in other words, S5≈S7), and spacing S6 between gate dielectric 84A disposed on adjacent fins 32B is substantially the same as spacing S8 between gate dielectric 84B disposed on adjacent fins 32D (in other words, S6≈S8).

In conventional IC devices, where a core region and an I/O region have fin structures with substantially the same fin pitches, different gate dielectric thicknesses result in spacing between I/O fins that is less than spacing between core fins, constraining gate electrode formation. For example, since the gate electrodes in the core region and the I/O region are typically formed at the same time and include many of the same layers, the narrower spacing between I/O fins constrains a number of layers, materials, and/or configurations for gate electrodes in the core region and the I/O region, limiting a range of threshold voltages available for FinFETs in the core region and the I/O region. In contrast, increasing fin pitch in I/O region 14 relative to core region 12 as described herein optimizes gate formation by allowing thicker gate dielectrics needed for I/O region 14 without constraining spacing for subsequently formed gate electrodes in core region 12 and I/O region 14. For example, because spacing between I/O fins and core fins are substantially the same after gate dielectric formation, gate electrode formation for core region 12 is not limited by spacing between I/O fins (in other words, gate electrode formation in core region 12 is decoupled from I/O spacing), increasing flexibility in formation of gate electrodes in core region 12 compared to conventional IC devices. Furthermore, increased spacing between I/O fins increases flexibility in formation of gate electrodes in I/O region 14 compared to conventional IC devices. The increased flexibility allows greater numbers of layers, materials, and/or configurations for gate electrodes in core region 12 and I/O region 14, and thus allows a wide range of voltage thresholds for different FinFETs of IC device 10, each of which is typically optimized for a specific operation (for example, high speed application, low power application, and/or other application). Such is achieved without impacting performance of core region 12 (for example, maintaining small fin-to-fin spacing desired to support continual IC scaling), performance of I/O region 14, and/or the gate fabrication process. Different embodiments may have different advantages, and no particular advantage is necessarily required of any embodiment.

Gate dielectrics 84A, 84B include a dielectric material, such as silicon oxide, high-k dielectric material, other suitable dielectric material, or combinations thereof. In the depicted embodiment, gate dielectrics 84A, 84B include one or more high-k dielectric layers including, for example, hafnium, aluminum, zirconium, lanthanum, tantalum, titanium, yttrium, oxygen, nitrogen, other suitable constituent, or combinations thereof. In some implementations, the one or more high-k dielectric layers include $HfO_2$, HfSiO, HfSiON, HfTaO, HfTiO, HfZrO, $ZrO_2$, $Al_2O_3$, $HfO_2$—$Al_2O_3$, $TiO_2$, $Ta_2O_5$, $La_2O_3$, $Y_2O_3$, other suitable high-k dielectric material, or combinations thereof. High-k dielectric material generally refers to dielectric materials having a high dielectric constant, for example, greater than that of silicon oxide (k≈3.9). In some implementations, the high-k dielectric material has a dielectric constant greater than or equal to about nine (k≥9). In some implementations, gate dielectrics 84A, 84B further include an interfacial layer (including a dielectric material, such as silicon oxide) disposed between the high-k dielectric layer and respective fins 32A-32D and isolation feature 34. In some implementations, gate dielectrics 84A, 84B include a nitrogen-doped oxygen-containing dielectric layer and a high-k dielectric layer disposed over the nitrogen-doped oxygen-containing dielectric layer. In some implementations, a ratio of a thickness of the high-k dielectric layer to a thickness of the nitrogen-doped oxygen-containing dielectric layer is less than 1. In some implementations, a ratio of a thickness of the nitrogen-doped oxygen-containing dielectric layer of gate dielectric 84B to a thickness of the nitrogen-doped oxygen-containing dielectric layer of gate dielectric 84A is greater than or equal to about 2. In some implementations, a ratio of a thickness of the high-k dielectric layer of gate dielectric 84B to a thickness of the high-k dielectric layer of gate dielectric 84A is greater than or equal to about 1. In some implementations, gate dielectrics 84A, 84B are configured to tune work functions of FinFET 13A, FinFET 13B, FinFET 15A, and/or FinFET 15B according to design requirements of IC device 10. Gate dielectrics 84A, 84B are formed by various processes, such as ALD, CVD, PVD, and/or other suitable process.

Gate electrodes 86A, 86B are respectively disposed over gate dielectrics 84A, 84B. Gate electrodes 86A, 86B include an electrically conductive material. In some implementations, gate electrodes 86A, 86B includes multiple layers, such as one or more capping layers, work function layers, glue/barrier layers, and/or metal fill (or bulk) layers. A capping layer can include a material that prevents or eliminates diffusion and/or reaction of constituents between gate dielectrics 84A, 84B and other layers of gate structures 50A-50D (in particular, gate layers including metal). In some implementation, the capping layer includes a metal and nitrogen, such as titanium nitride (TiN), tantalum nitride (TaN), tungsten nitride ($W_2N$), titanium silicon nitride (TiSiN), tantalum silicon nitride (TaSiN), or combinations thereof. A work function layer can include a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. A glue/barrier layer can include a material that promotes adhesion between adjacent layers, such as the work function layer and the metal fill layer, and/or a material that blocks and/or reduces diffusion between gate layers, such as such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as Al, W, and/or Cu. In some implementations, a hard mask layer (including, for example, silicon nitride or silicon carbide) is disposed over at least a portion of gate electrodes 86A, 86B. Gate electrodes 86A, 86B are formed by various deposition processes, such as ALD, CVD, PVD, and/or other suitable process. Because spacings S5-S8 are substantially the same, formation of gate electrode 86A is not limited by formation of gate electrode 86B, facilitating flexibility in tuning gate electrode 86A for optimal performance of FinFET 13A and/or FinFET 13B. Furthermore, increasing spacings S7, S8 as described herein further facilitates flexibility in tuning gate electrode 86B for optimal performance of FinFET 15A and/or FinFET 15B. Common process windows can thus be implemented when forming gate electrodes 86A, 86B. A CMP process can be performed to remove any excess material of the various layers of gate electrodes 86a, 86B, planarizing gate structures 50A-50D.

Figure 8A:
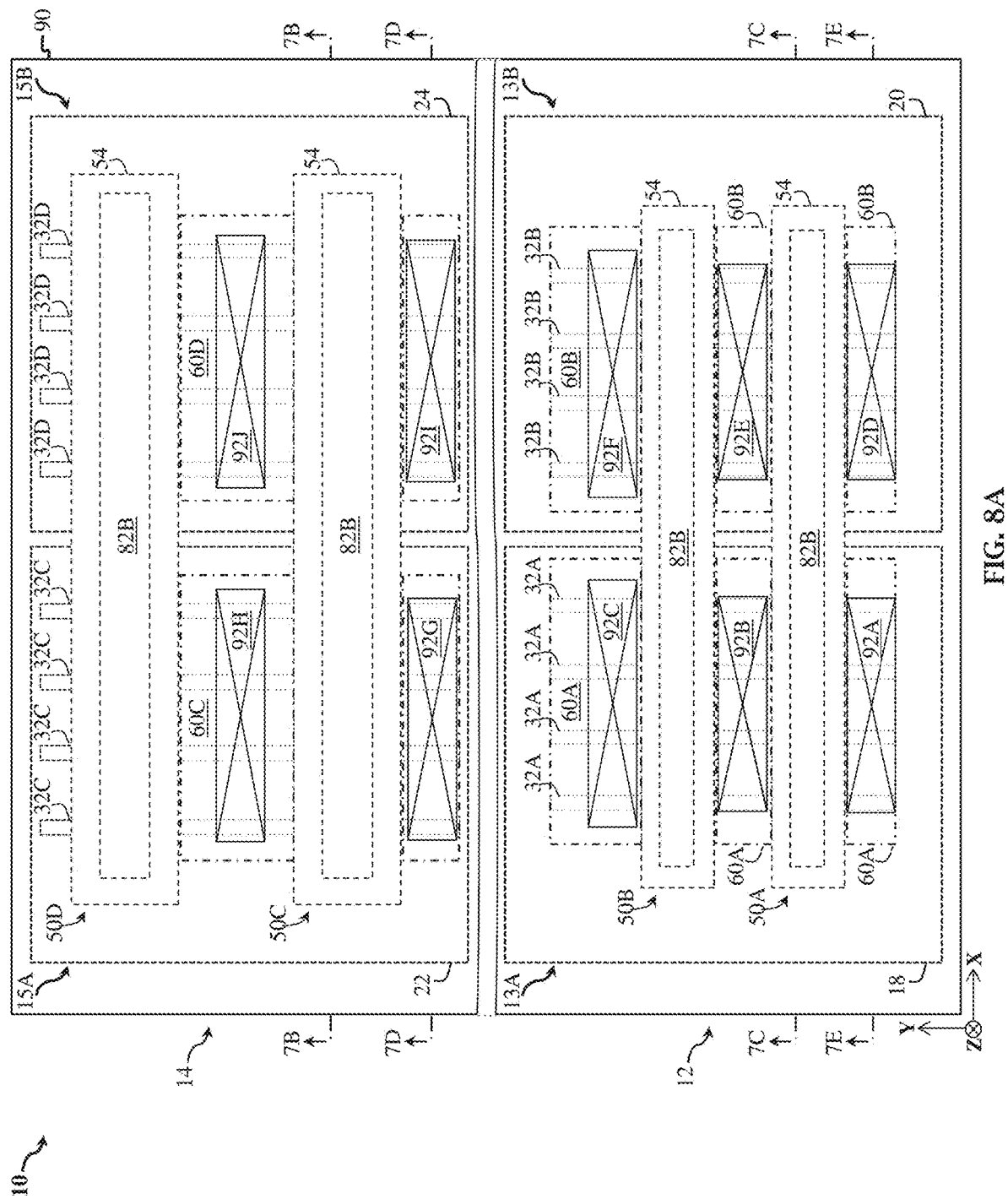

Turning to FIGS. 8A-8E, FIG. 8A is a top view of IC device 10, FIG. 8B is a fragmentary cross-sectional view of IC device 10 along line B-B of FIG. 8A, FIG. 8C is a fragmentary cross-sectional view of IC device 10 along line C-C of FIG. 8A, FIG. 8D is a fragmentary cross-sectional view of IC device 10 along line D-D of FIG. 8A, and FIG. 8E is a fragmentary cross-sectional view of IC device 10 along line E-E of FIG. 8A. In FIGS. 8A-8E, IC device 10 can undergo further processing to complete fabrication. In some implementations, various contacts are formed to facilitate operation of IC device 10. For example, an MLI feature is formed over substrate 16. The MLI feature electrically couples various devices (for example, transistors, resistors, capacitors, and/or inductors) and/or components (for example, gate structures and/or source/drain features) of IC device 10, such that the various devices and/or components can operate as specified by design requirements of IC device 10. The MLI feature includes a combination of dielectric layers and electrically conductive layers (for example, metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of the MLI feature. During operation of IC device 10, the interconnect features are configured to route signals between the devices (here, FinFET 13A, FinFET 13B, FinFET 15A, and FinFET 15B) and/or the components of IC device 10 and/or distribute signals (for example, clock signals, voltage signals, and/or ground signals) to the devices and/or the components of IC device 10. The present disclosure contemplates the MLI feature including any number and/or configuration of dielectric layers and/or conductive layers depending on design requirements of IC device 10.

The MLI feature can include additional ILD layers formed over substrate 16. In the depicted embodiment, an ILD layer 90, which is a portion of the MLI feature, is disposed over ILD layer 70 and gate structures 50A-50D. ILD layer 90 is similar to ILD layer 70. In some implementations, ILD layer 90 is a first level ILD of the MLI feature (for example, ILD-1). In some implementations, a CESL is disposed between ILD layer 90 and ILD layer 70, which is similar to the CESLs described herein. In furtherance of the depicted embodiment, device-level contacts 92A-92J, vias (not shown), and conductive lines (not shown) (collectively referred to as a metal layer, such as a metal one (M1) layer, of the MLI feature) are disposed in the ILD layers of the MLI feature to form interconnect structures. Device-level contacts 92A-92J, vias, and conductive lines include any suitable electrically conductive material, such as Ta, Ti, Al, Cu, Co, W, TiN, TaN, other suitable conductive materials, or combinations thereof. Various conductive materials can be combined to provide device-level contacts 92A-92J, vias, and/or conductive lines with various layers, such as one or more barrier layers, adhesion layers, liner layers, bulk layers, other suitable layers, or combinations thereof. In some implementations, device-level-contacts 92A-92J include Ti, TiN, and/or Co; vias include Ti, TiN, and/or W; and conductive lines include Cu, Co, and/or Ru. Device-level contacts 92A-92J, vias, and conductive lines are formed by patterning ILD layer 70, ILD layer 90, and/or other ILD layers of the MLI feature. Patterning the ILD layers can include lithography processes and/or etching processes to form openings (trenches), such as contact openings, via openings, and/or line openings in respective ILD layers. In some implementations, the lithography processes include forming a resist layer over respective ILD layers, exposing the resist layer to patterned radiation, and developing the exposed resist layer, thereby forming a patterned resist layer that can be used as a masking element for etching opening(s) in respective ILD layers. The etching processes include dry etching processes, wet etching processes, other etching processes, or combinations thereof. Thereafter, the opening(s) are filled with one or more conductive materials. The conductive material(s) can be deposited by PVD, CVD, ALD, electroplating, electroless plating, other suitable deposition process, or combinations thereof. Thereafter, any excess conductive material(s) can be removed by a planarization process, such as a CMP process, thereby planarizing a top surface of the ILD layers (for example, ILD layer 90), device-level contacts 92A-92J, vias, and/or conductive lines.

Device-level contacts 92A-92J (also referred to as local interconnects or local contacts) electrically couple and/or physically couple IC device features, such as features of FinFET 13A, FinFET 13B, FinFET 15A, and FinFET 15B to the MLI feature. For example, device-level contacts 92A-92J are metal-to-device (MD) contacts, which generally refer to contacts to a conductive region, such as source/drain regions, of IC device 10. In the depicted embodiment, device-level contacts 92A-92C are disposed on respective epitaxial source/drain features 60A, such that device-level contacts 92A-92C physically (or directly) connect the source/drain regions of FinFET 13A to the MLI feature (for example, to respective vias); device-level contacts 92D-92F are disposed on respective epitaxial source/drain features 60B, such that device-level contacts 92A-92F physically (or directly) connect the source/drain regions of FinFET 13B to the MLI feature (for example, to respective vias); device-level contacts 92G, 92H are disposed on respective epitaxial source/drain features 60C, such that device-level contacts 92G, 92H physically (or directly) connect the source/drain regions of FinFET 15A to the MLI feature (for example, to respective vias); and device-level contacts 92I, 92J are disposed on respective epitaxial source/drain features 60D, such that device-level contacts 92I, 92J physically (or directly) connect the source/drain regions of FinFET 15B to the MLI feature (for example, to respective vias). In some implementations, one or more of device-level contacts 92A-92J are dummy contacts, which have physical properties similar to device-level contacts to enable a substantially uniform processing environment. Device-level contacts 92A-92J extend through ILD layer 90 and/or ILD layer 70, though the present disclosure contemplates embodiments where device-level contacts 92A-92J extend through more or less ILD layers and/or CESLs of the MLI feature. In some implementations, the MLI feature includes device-level contacts that electrically couple and/or physically couple one or more of gate structures 50A-50D to the MLI feature. In such implementations, the device-level contacts are disposed on respective gate structures 50A-50D, such that the device-level contacts physically (or directly) connect gate structures 50A-50D to the MLI feature (for example, to respective vias). Such device-level contacts are thus referred to as a gate contact (CG) or metal-to-poly (MP) contact, which generally refers to a contact to a gate structure, such as a poly gate structure or a metal gate structure. In some implementations, the MLI feature includes vias that electrically couple and/or physically couple one or more of gate structures 50A-50D to the MLI feature. In such implementations, the vias are disposed on respective gate structures 50A-50D, such that the vias physically (or directly) connect respective gate structures 50A-50D to the MLI feature (for example, to respective conductive lines). The present disclosure contemplates any configuration of device-level contacts, vias, and/or conductive lines.

The present disclosure provides for many different embodiments. An exemplary integrated circuit device includes a first multi-fin structure having a first channel region disposed between a first source region and a first drain region and a second multi-fin structure having a second channel region disposed between a second source region and a second drain region. A first gate structure traverses the first multi-fin structure, such that the first gate structure is disposed over the first channel region. A second gate structure traverses the second multi-fin structure, such that the second gate structure is disposed over the second channel region. The first gate structure includes a first gate dielectric having a first thickness, the second gate structure includes a second gate dielectric having a second thickness, and the first thickness is greater than the second thickness. The first multi-fin structure has a first pitch in the first channel region, the second multi-fin structure has a second pitch in the second channel region, and the first pitch is greater than the second pitch. In some implementations, a ratio of the first pitch to the second pitch is about 1.05 to about 1.15. In some implementations, a ratio of the first thickness to the second thickness is about 1.3 to about 1.8. In some implementations, a width of fins of the first multi-fin structure is less than a width of fins of the second multi-fin structure. In some implementations, the first pitch is less than about 30 nm and the second pitch is less than about 28 nm. In some implementations, a first spacing between the first gate dielectric disposed on adjacent fins of the first multi-fin structure is substantially the same to a second spacing between the second gate dielectric disposed on adjacent fins of the second multi-fin structure. In some implementations, the integrated circuit device further includes an I/O region and a core region, wherein the first multi-fin structure and the first gate structure are a portion of a transistor disposed in the I/O region and the second multi-fin structure and the second gate structure are a portion of a transistor disposed in the core region. In some implementations, the integrated circuit device further includes a first epitaxial source/drain feature disposed over the first source region and the first drain region and a second epitaxial source/drain feature disposed over the second source region and the second drain region, wherein the first epitaxial source/drain feature is partially merged and the second epitaxial source/drain feature is fully merged.

Another exemplary integrated circuit device includes a first fin-like field effect transistor that includes a first gate structure traversing first fins and a second fin-like field effect transistor that includes a second gate structure traversing second fins. The first gate structure includes a first gate dielectric and a first gate electrode, where the first gate dielectric has a first thickness. The second gate structure includes a second gate dielectric and a second gate electrode, where the second gate dielectric has a second thickness. The first thickness is greater than the second thickness. A spacing between the first gate dielectric disposed over adjacent first fins is substantially the same as a spacing between the second gate dielectric disposed over adjacent second fins. In some implementations, the first thickness is about 3% to about 8% greater than the second thickness. In some implementations, a first pitch of a channel region of the first fins is about 5% to about 15% greater than a second pitch of a channel region of the second fins. In some implementations, a width of a top portion of an upper fin active region of the first fins is less than a width of a top portion of an upper fin active region of the second fins. In some implementations, the top portion is about 5 nm of the first fins and the second fins. In some implementations, the first fin-like field effect transistor includes a partially merged epitaxial source/drain feature disposed over the first fins, and the second fin-like field effect transistor includes a fully merged epitaxial source/drain feature disposed over the second fins. In some implementations, the first fin-like field effect transistor is disposed in an input/output region and the second fin-like field effect transistor is disposed in a core region.

An exemplary method includes forming a first multi-fin structure having a first pitch in a first channel region and a second multi-fin structure having a second pitch in a second channel region. The first pitch is greater than the second pitch. The method further includes forming a first gate structure over the first channel region of the first multi-fin structure. The first gate structure includes a first gate dielectric having a first thickness. The method further includes forming a second gate structure over the second channel region of the second multi-fin structure. The second gate structure includes a second gate dielectric having a second thickness and the first thickness is greater than the second thickness. In some implementations, a ratio of the first pitch to the second pitch is about 1.05 to about 1.15. In some implementations, a ratio of the first thickness to the second thickness is about 1.3 to about 1.8. In some implementations, the forming the first gate structure includes replacing a first dummy gate with a first metal gate, wherein the first metal gate includes the first gate dielectric and a first gate electrode disposed over the first gate dielectric. In some implementations, the forming the second gate structure includes replacing a second dummy gate with a second metal gate, wherein the second metal gate includes the second gate dielectric and a second gate electrode disposed over the second gate dielectric. In some implementations, after forming the first gate dielectric and the second gate dielectric, a spacing between the first gate dielectric disposed on adjacent fins of the first multi-fin structure is substantially the same to a spacing between the second gate dielectric disposed on adjacent fins of the second multi-fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first multi-fin structure having a first pitch in a first channel region and a second multi-fin structure having a second pitch in a second channel region, wherein the first pitch is greater than the second pitch;
    forming a first gate structure over the first channel region of the first multi-fin structure, wherein the first gate structure includes a first gate dielectric having a first thickness and a first gate electrode over the first gate dielectric;
    forming a second gate structure over the second channel region of the second multi-fin structure, wherein the second gate structure includes a second gate dielectric having a second thickness and a second gate electrode over the second gate dielectric, wherein the second thickness is less than the first thickness; and
    configuring a ratio of the first thickness to the second thickness and a ratio of the first pitch to the second pitch to provide a common process window for formation of the first gate electrode and the second gate electrode at the same time, wherein:
    the ratio of the first pitch to the second pitch depends on the ratio of the first thickness to the second thickness,
    a first spacing between the first gate dielectric disposed on directly adjacent first fins of the first multi-fin structure depends on the first thickness and the first pitch,
    a second spacing between the second gate dielectric disposed on directly adjacent second fins of the second multi-fin structure depends on the second thickness and the second pitch, and
    the common process window for forming the first gate electrode and the second gate electrode at the same time is provided when the first spacing between the first gate dielectric disposed on directly adjacent first fins of the first multi-fin structure is substantially the same as the second spacing between the second gate dielectric disposed on directly adjacent second fins of the second multi-fin structure.

2. The method of claim 1, wherein a ratio of the first pitch to the second pitch is about 1.05 to about 1.15.

3. The method of claim 1, wherein a ratio of the first thickness to the second thickness is about 1.3 to about 1.8.

4. The method of claim 1, wherein the forming the first gate structure and the forming the second gate structure includes performing a gate replacement process.

5. The method of claim 1, wherein the first pitch is less than or equal to about 30 nm and the second pitch is less than or equal to about 28 nm.

6. The method of claim 1, further comprising an input/output (I/O) region and a core region, wherein the first multi-fin structure and the first gate structure are a portion of a transistor disposed in the I/O region and the second multi-fin structure and the second gate structure are a portion of a transistor disposed in the core region.

7. The method of claim 1, further comprising:
forming a merged first epitaxial source/drain feature over a first source region and a first drain region of first fins of the first multi-fin structure; and
forming a merged second epitaxial source/drain feature over a second source region and a second drain region of second fins of the second multi-fin structure, wherein the ratio of the first pitch to the second pitch is further configured to ensure that epitaxial material grown from at least two directly adjacent first fins of the first multi-fin structure merges when forming the merged first epitaxial source/drain feature.

8. The method of claim 7, wherein:
the merged first epitaxial source/drain feature is disposed over and spans each of the first fins of the first multi-fin structure and the merged first epitaxial source/drain feature includes at least one gap between directly adjacent first fins; and
the merged second epitaxial source/drain feature is disposed over and spans each of the second fins of the second multi-fin structure and the merged second epitaxial source/drain feature is free of gaps between directly adjacent second fins.

9. A method comprising:
forming a first fin, a second fin, a third fin, and a fourth fin over a substrate, wherein the first fin and the second fin are separated by a first distance in an input/output (I/O) region, the third fin and the fourth fin are separated by a second distance in a logic region, and the first distance is greater than the second distance;
forming an isolation region over a lower portion of the first fin, a lower portion of the second fin, a lower portion of the third fin, and a lower portion of the fourth fin;
forming a first gate structure and a second gate structure, wherein the first gate structure is disposed over a channel region of an upper portion of the first fin and a channel region of an upper portion of the second fin and the second gate structure is disposed over a channel region of an upper portion of the third fin and a channel region of an upper portion of the fourth fin, and further wherein the first gate structure includes a first dummy gate and the second gate structure includes a second dummy gate;
forming merged first epitaxial source/drain features and merged second epitaxial source/drain features, wherein the merged first epitaxial source/drain features are disposed over source/drain regions of the first fin and source/drain regions of the second fin and the merged second epitaxial source/drain features are disposed over source/drain regions of the third fin and source/drain regions of the fourth fin;
forming an interlevel dielectric layer over the merged first epitaxial source/drain features, the merged second epitaxial source/drain features, the first gate structure, and the second gate structure;
removing the first dummy gate from the first gate structure to form a first opening and the second dummy gate from the second gate structure to form a second opening, wherein the first opening exposes the channel region of the upper portion of the first fin and the channel region of the upper portion of the second fin and the second opening exposes the channel region of the upper portion of the third fin and the channel region of the upper portion of the fourth fin; and
forming a first metal gate in the first opening and a second metal gate in the second opening, wherein the first metal gate includes a first gate electrode disposed over a first gate dielectric having a first thickness, the second metal gate includes a second gate electrode disposed over a second gate dielectric having a second thickness, and the first thickness is greater than the second thickness;
configuring a ratio of the first thickness to the second thickness and a ratio of the first distance to the second distance to provide a common process window for forming the first gate electrode and the second gate electrode at the same time and to ensure merging of epitaxial material grown from the first fin and the second fin when forming the merged first epitaxial source/drains and epitaxial material grown from the third fin and the fourth fin when forming the merged second epitaxial source/drains; and
wherein a ratio of the first distance to the second distance accounts for the ratio of the first thickness to the second thickness and the common process window for forming the first gate electrode and the second gate electrode at the same time is provided when a first spacing between the first gate dielectric disposed on the first fin and the second fin that is substantially the same as a second spacing between the second gate dielectric disposed on the third fin and the fourth fin.

10. The method of claim 9, wherein the first thickness is about 30% greater than the second thickness.

11. The method of claim 9, wherein the ratio of the first distance to the second distance is about 1.05 to about 1.15 and the ratio of the first thickness to the second thickness is about 1.3 to about 1.8.

12. The method of claim 9, wherein the first metal gate has a first work function and the second metal gate has a second work function that is different than the first work function.

13. The method of claim 9, further comprising:
forming a fifth fin over the substrate, wherein the first fin and the fifth fin are separated by the first distance in the I/O region, wherein epitaxial material grown from the fifth fin when forming the merged first epitaxial source/drain features does not merge with the epitaxial material grown from the first fin when forming the merged first epitaxial source/drain features.

14. The method of claim 9, wherein the first fin and the second fin are disposed over a first doped region of the substrate and the third fin and the fourth fin are disposed over a second doped region of the substrate, the method further comprising:
forming a fifth fin and a sixth fin over a third doped region of the substrate and a seventh fin and an eighth fin over a fourth doped region of the substrate, wherein the fifth fin and the sixth fin are separated by the first distance in the I/O region and the seventh fin and the eighth fin are separated by the second distance in the logic region;

forming the isolation region over a lower portion of the fifth fin, a lower portion of the sixth fin, a lower portion of the seventh fin, and a lower portion of the eighth fin;

forming the first gate structure over a channel region of an upper portion of the fifth fin and a channel region of an upper portion of the sixth fin and forming the second gate structure over a channel region of an upper portion of the seventh fin and a channel region of an upper portion of the eighth fin;

forming third epitaxial source/drain features and fourth epitaxial source/drain features, wherein the third epitaxial source/drain features are disposed over source/drain regions of the fifth fin and source/drain regions of the sixth fin and the fourth epitaxial source/drain features are disposed over source/drain regions of the seventh fin and source/drain regions of the eighth fin;

forming the interlevel dielectric layer over the third epitaxial source/drain features and the fourth epitaxial source/drain features; and wherein the first opening further exposes the channel region of the upper portion of the fifth fin and the channel region of the upper portion of the sixth fin and the second opening further exposes the channel region of the upper portion of the seventh fin and the channel region of the upper portion of the eighth fin.

15. The method of claim 14, wherein the first fin and the second fin are a portion of a first transistor, the third fin and the fourth fin are a portion of a second transistor, the fifth fin and the sixth fin are a portion of a third transistor, and the seventh fin and the eighth fin are a portion of a fourth transistor.

16. A method comprising:
forming a first fin-like field effect transistor that includes a first gate structure traversing first fins, wherein the first gate structure includes a first gate dielectric and a first gate electrode;

forming a second fin-like field effect transistor that includes a second gate structure traversing second fins, wherein the second gate structure includes a second gate dielectric and a second gate electrode;

wherein the first fins have a first fin pitch, the second fins have a second fin pitch, and the first fin pitch is greater than the second fin pitch;

wherein the first gate dielectric has a first thickness, the second gate dielectric has a second thickness, and the first thickness is greater than the second thickness;

wherein a ratio of the first fin pitch to the second fin pitch is about 1.05 to about 1.15 and the ratio of the first thickness to the second thickness is about 1.3 to about 1.8; and wherein the ratio of the first fin pitch to the second fin pitch and the ratio of the first thickness to the second thickness provide a spacing between the first gate dielectric disposed over sidewalls of directly adjacent first fins that is substantially the same as a spacing between the second gate dielectric disposed over sidewalls of directly adjacent second fins, such that a common process window is provided for forming the first gate electrode and the second gate electrode at the same time.

17. The method of claim 16, wherein the first fin pitch and second fin pitch are both less than about 30 nm.

18. The method of claim 16, wherein:
the first fin-like field effect transistor includes a merged first epitaxial source/drain feature disposed over and spanning the first fins with at least one interruption between epitaxial material extending from directly adjacent first fins; and the second fin-like field effect transistor includes a merged second epitaxial source/drain feature disposed over and spanning the second fins without interruption between epitaxial material extending from directly adjacent second fins.

19. The method of claim 16, further comprising:
forming a third fin-like field effect transistor that includes a third gate structure traversing third fins, wherein the third gate structure includes a third gate dielectric and a third gate electrode;

forming a fourth fin-like field effect transistor that includes a fourth gate structure traversing fourth fins, wherein the fourth gate structure includes a fourth gate dielectric and a fourth gate electrode;

wherein the third fins have a third fin pitch, the fourth fins have a fourth fin pitch, and the third fin pitch is greater than the fourth fin pitch;

wherein the third gate dielectric has a third thickness, the fourth gate dielectric has a fourth thickness, and the third thickness is greater than the fourth thickness; and wherein a ratio of the third fin pitch to the fourth fin pitch is about 1.05 to about 1.15 and the ratio of the third thickness to the fourth thickness is about 1.3 to about 1.8; and wherein the ratio of the third fin pitch to the fourth fin pitch and the ratio of the third thickness to the fourth thickness are provide a spacing between the third gate dielectric disposed over sidewalls of directly adjacent third fins that is substantially the same as a spacing between the fourth gate dielectric disposed over sidewalls of directly adjacent fourth fins.

20. The method of claim 16, wherein the first fin-like field effect transistor is an input/output transistor and the second fin-like field effect transistor is a core transistor.

* * * * *